US012368431B2

(12) United States Patent
Abbott et al.

(10) Patent No.: US 12,368,431 B2
(45) Date of Patent: Jul. 22, 2025

(54) ACOUSTIC WAVE FILTER WITH MULTIPLE ACOUSTIC WAVE DEVICES ON A SUBTRATE

(71) Applicant: Skyworks Solutions, Inc., Irvine, CA (US)

(72) Inventors: Benjamin Paul Abbott, Irvine, CA (US); Gong Bin Tang, Moriguchi (JP); Rei Goto, Osaka (JP); Keiichi Maki, Suita (JP)

(73) Assignee: Skyworks Solutions, Inc., Irvine, CA (US)

( * ) Notice: Subject to any disclaimer, the term of this patent is extended or adjusted under 35 U.S.C. 154(b) by 323 days.

(21) Appl. No.: 17/651,300

(22) Filed: Feb. 16, 2022

(65) Prior Publication Data
US 2022/0271734 A1    Aug. 25, 2022

Related U.S. Application Data

(60) Provisional application No. 63/151,907, filed on Feb. 22, 2021, provisional application No. 63/151,912, (Continued)

(51) Int. Cl.
H03H 9/145    (2006.01)
H03H 3/10    (2006.01)
(Continued)

(52) U.S. Cl.
CPC .......... H03H 9/14541 (2013.01); H03H 3/10 (2013.01); H03H 9/02574 (2013.01);
(Continued)

(58) Field of Classification Search
CPC .. H03H 9/14541; H03H 3/10; H03H 9/02574; H03H 9/02834; H03H 9/02889; H03H 9/25; H03H 9/6483; H03H 9/6489
(Continued)

(56) References Cited

U.S. PATENT DOCUMENTS 7,289,008 B2    10/2007    Kuroki et al.
7,576,471 B1    8/2009    Solal
(Continued)

OTHER PUBLICATIONS

"Densities of Metals and Elements Table", Engineers Edge, 2000, (accessed Jul. 25, 2024), in 6 pages. URL: https://www.engineersedge.com/materials/densities_of_metals_and_elements_table_13976.htm.
(Continued)

Primary Examiner — Yuqing Xiao
Assistant Examiner — Christopher Richard Walker
(74) Attorney, Agent, or Firm — Knobbe, Martens, Olson & Bear LLP

(57) ABSTRACT

An acoustic wave filter includes a piezoelectric layer. A first acoustic wave device includes a portion of the piezoelectric layer and a first multi-layer interdigital transducer electrode disposed over the first portion of the piezoelectric layer. Additional acoustic wave devices are coupled to the first acoustic wave device, the additional acoustic wave devices including a second portion of the piezoelectric layer and a plurality of multi-layer interdigital transducer electrodes disposed over the second portion of the piezoelectric layer. At least one of the plurality of multi-layer interdigital transducer electrodes includes a layer that is thinner than a corresponding layer of the same material of the first multi-layer interdigital transducer electrode of the first acoustic wave device.

20 Claims, 25 Drawing Sheets

Related U.S. Application Data filed on Feb. 22, 2021, provisional application No. 63/151,904, filed on Feb. 22, 2021.

(51) Int. Cl.
*H03H 9/02* (2006.01)
*H03H 9/25* (2006.01)
*H03H 9/64* (2006.01)

(52) U.S. Cl.
CPC .... *H03H 9/02834* (2013.01); *H03H 9/02889* (2013.01); *H03H 9/02992* (2013.01); *H03H 9/25* (2013.01); *H03H 9/6406* (2013.01); *H03H 9/6483* (2013.01); *H03H 9/6489* (2013.01)

(58) Field of Classification Search
USPC .......................................................... 367/180
See application file for complete search history.

(56) References Cited

U.S. PATENT DOCUMENTS

| | | | |
|---|---|---|---|
| 8,294,331 B2* | 10/2012 | Abbott | ................. H03H 9/1452 29/25.35 |
| 9,640,750 B2 | 5/2017 | Nakanishi et al. | |
| 9,860,006 B1 | 1/2018 | Okuda | |
| 10,797,679 B2 | 10/2020 | Horikawa | |
| 11,177,791 B2* | 11/2021 | Solal | ..................... H03H 9/1457 |
| 11,588,469 B2 | 2/2023 | Daimon | |
| 11,683,019 B2 | 6/2023 | Matsuoka et al. | |
| 2018/0054179 A1* | 2/2018 | Gamble | ................... H03H 3/10 |
| 2019/0074813 A1* | 3/2019 | Zou | ........................ H03H 9/562 |
| 2019/0245517 A1* | 8/2019 | Nosaka | ................ H03H 9/6403 |
| 2019/0326879 A1* | 10/2019 | Nakamura | ............ H03H 9/058 |
| 2020/0212876 A1* | 7/2020 | Goto | ..................... H03H 9/173 |
| 2021/0126621 A1* | 4/2021 | Plesski | ................... H03H 9/132 |
| 2022/0271730 A1 | 8/2022 | Abbott et al. | |
| 2022/0271733 A1 | 8/2022 | Abbott et al. | |

OTHER PUBLICATIONS

"Silica-Silicon Dioxide (SiO2)", AZO Materials, 2001 (accessed Jul. 25, 2024), in 7 pages. URL: https://www.azom.com/article.aspx?Article1D=1114.

Bell, T., "Electrical Conductivity of Metals", ThoughtCo., Aug. 3, 2021 (accessed Jul. 25, 2024), in 5 pages. URL: https://www.thoughtco.com/electrical-conductivity-in-metals-2340117.

\* cited by examiner

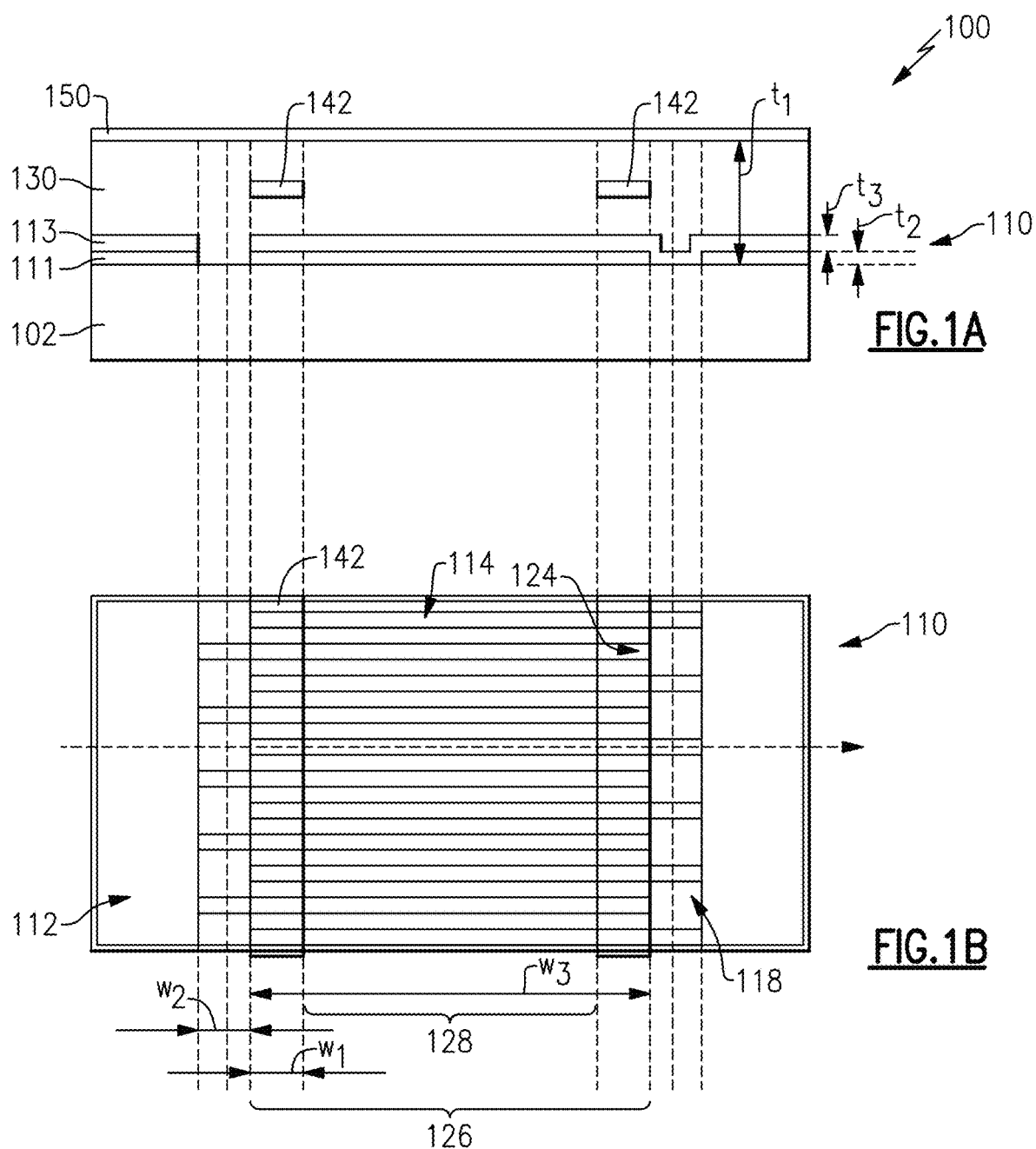

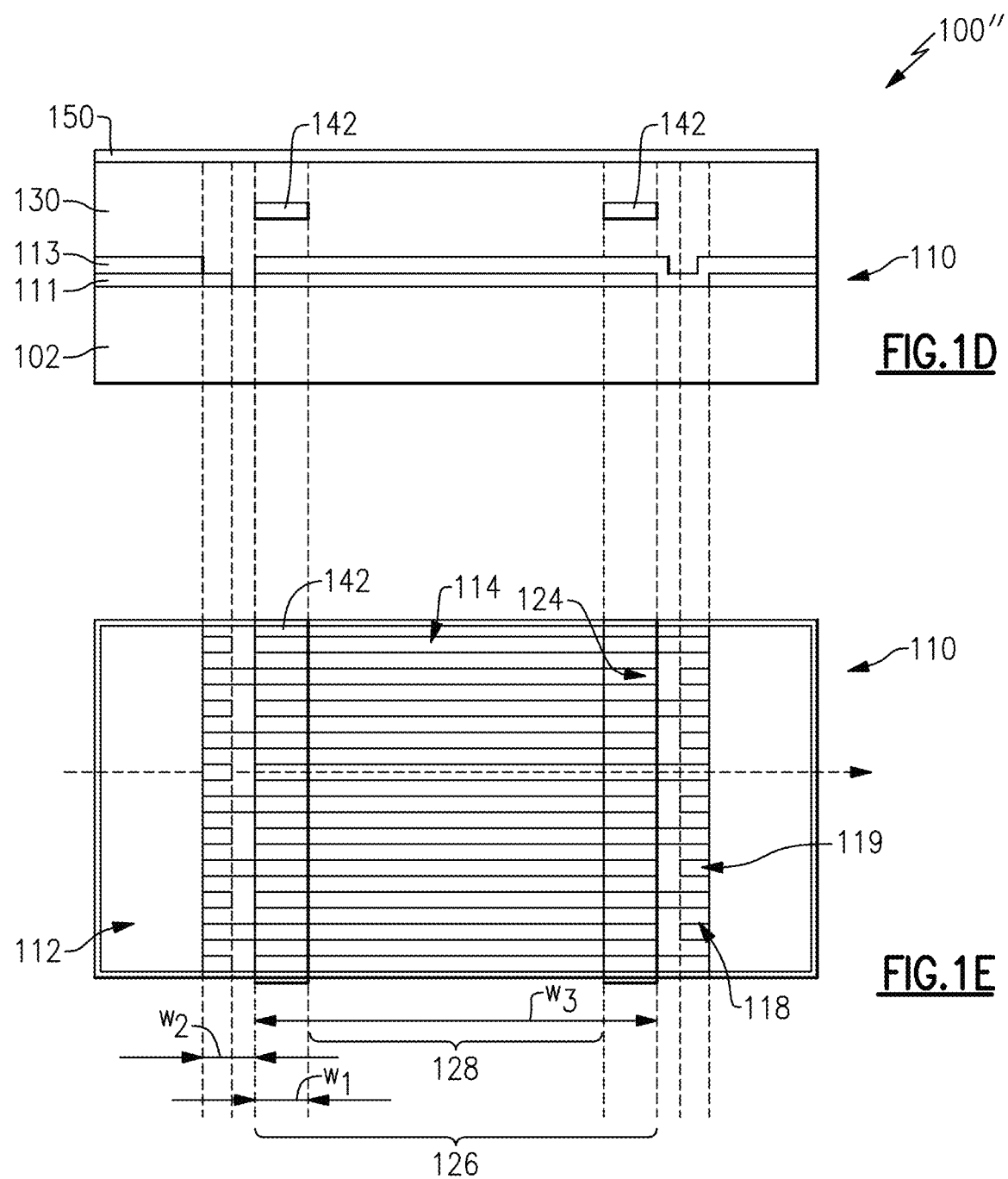

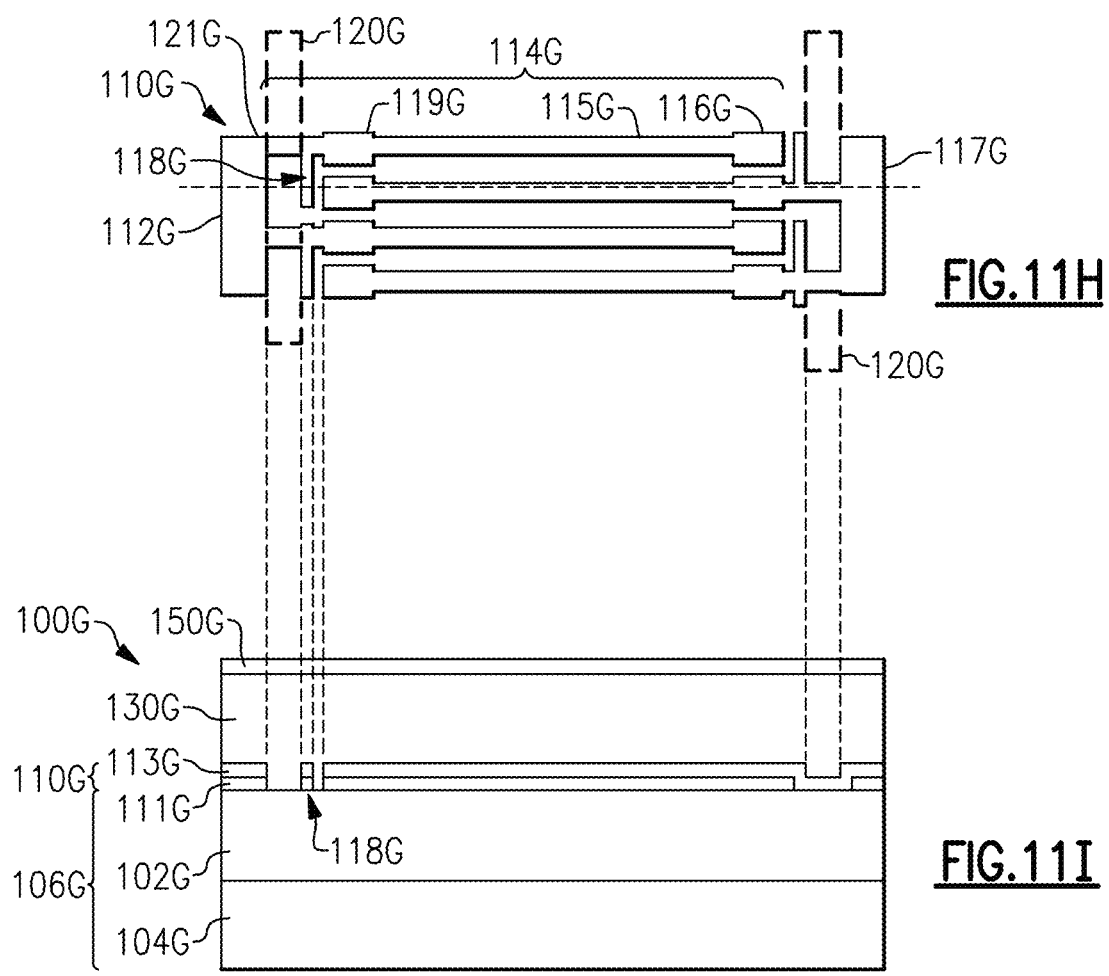

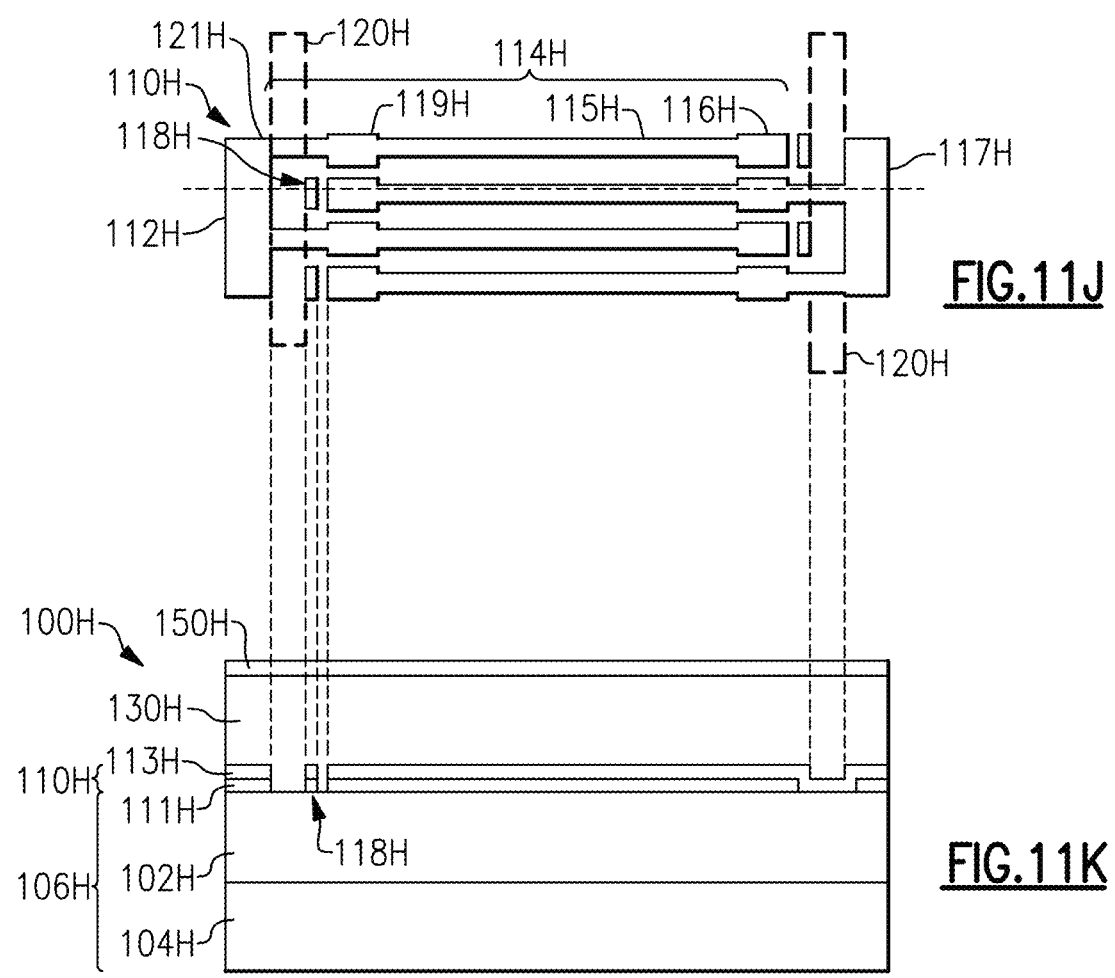

ACOUSTIC WAVE FILTER WITH MULTIPLE ACOUSTIC WAVE DEVICES ON A SUBTRATE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Technical Field

Embodiments of this disclosure relate to acoustic wave devices, and more particularly to an acoustic wave filter with multiple acoustic wave devices on a single chip or substrate.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transductor electrode on a piezoelectric substrate. The surface acoustic wave resonator can generate a surface acoustic wave on a surface of the piezoelectric layer on which the interdigital transductor electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In accordance with one aspect of the disclosure, an acoustic wave device is provided. The acoustic wave device comprises a piezoelectric layer. An interdigital transducer electrode is disposed over the piezoelectric layer, the interdigital transducer electrode being thicker in a center region of the interdigital transducer electrode than in a gap region of the interdigital transducer electrode to thereby reduce a mass loading of the interdigital transducer electrode in the gap region.

In accordance with another aspect of the disclosure, an acoustic wave device is provided. The acoustic wave device comprises a piezoelectric layer. An interdigital transducer electrode includes a first layer disposed over the piezoelectric layer and a second layer disposed over the first layer, the second layer being of a less dense material than the first layer. A thickness of the first layer in a gap region of the interdigital transducer electrode is smaller than a thickness of the first layer in a center region of the interdigital transducer electrode to thereby reduce a mass loading of the interdigital transducer electrode in the gap region.

In accordance with another aspect of the disclosure, an acoustic wave filter is provided. The acoustic wave filter comprises an acoustic wave device including a piezoelectric layer and a multi-layer interdigital transducer electrode including a first layer disposed over the piezoelectric layer and a second layer disposed over the first layer, the second layer being of a less dense material than the first layer. A thickness of the first layer in a gap region of the interdigital transducer electrode is smaller than a thickness of the first layer in a center region of the interdigital transducer electrode to thereby reduce a mass loading of the interdigital transducer electrode in the gap region. The acoustic wave filter also comprises a plurality of additional acoustic wave devices, the acoustic wave device and the plurality of additional acoustic wave devices together configured to filter a radio frequency signal.

In accordance with another aspect of the disclosure, a radio frequency module is provide. The radio frequency module comprises a package substrate and an acoustic wave filter configured to filter a radiofrequency signal. The acoustic wave filtering includes an acoustic wave resonator that includes a piezoelectric layer and an interdigital transducer electrode including a first layer disposed over the piezoelectric layer and a second layer disposed over the first layer, the second layer being of a less dense material than the first layer. A thickness of the first layer in a gap region of the interdigital transducer electrode is smaller than a thickness of the first layer in a center region of the interdigital transducer electrode to thereby reduce a mass loading of the interdigital transducer electrode in the gap region. The radiofrequency module also comprises additional circuitry, the acoustic wave filter and additional circuitry disposed on the package substrate.

In accordance with another aspect of the disclosure a wireless communication device is provided. The wireless communication device comprises an antenna and a front end module including an acoustic wave filter configured to filter a radio frequency signal associated with the antenna. The acoustic wave filter includes one or more acoustic wave devices that each include a piezoelectric layer and an interdigital transducer electrode including a first layer disposed over the piezoelectric layer and a second layer disposed over the first layer, the second layer being of a less dense material than the first layer. A thickness of the first layer in a gap region of the interdigital transducer electrode is smaller than a thickness of the first layer in a center region of the interdigital transducer electrode to thereby reduce a mass loading of the interdigital transducer electrode in the gap region.

In accordance with another aspect of the disclosure, a method of manufacturing an acoustic wave device is provided. The method comprises forming or providing a piezoelectric layer and forming or providing an interdigital transducer electrode over the piezoelectric layer. The interdigital transducer electrode includes a first layer over the piezoelectric layer and a second layer over the first layer, the second layer being of a less dense material than the first layer. A thickness of the first layer in a gap region of the interdigital transducer electrode is smaller than a thickness of the first layer in a center region of the interdigital transducer electrode to thereby reduce a mass loading of the interdigital transducer electrode in the gap region.

In accordance with another aspect of the disclosure, an acoustic wave device is provided. The acoustic wave device comprises a piezoelectric layer and an interdigital transducer electrode. The interdigital transducer electrode includes a first layer disposed over the piezoelectric layer and a second layer disposed over the first layer, the second layer being of a more dense material than the first layer. A thickness of the second layer in a gap region of the interdigital transducer electrode is smaller than a thickness of the second layer in a center region of the interdigital transducer electrode to thereby reduce a mass loading of the interdigital transducer electrode in the gap region.

In accordance with another aspect of the disclosure, an acoustic wave filter is provided. The acoustic wave filter comprises an acoustic wave device including a piezoelectric layer and a multi-layer interdigital transducer electrode including a first layer disposed over the piezoelectric layer and a second layer disposed over the first layer, the second layer being of a more dense material than the first layer. A thickness of the second layer in a gap region of the interdigital transducer electrode is smaller than a thickness of the second layer in a center region of the interdigital transducer electrode to thereby reduce a mass loading of the interdigital transducer electrode in the gap region. The acoustic wave filter also comprises a plurality of additional acoustic wave devices, the acoustic wave device and the plurality of additional acoustic wave devices together configured to filter a radio frequency signal.

In accordance with another aspect of the disclosure a radio frequency module is provided. The radio frequency module comprises a package substrate and an acoustic wave filter configured to filter a radiofrequency signal. The acoustic wave filter includes an acoustic wave resonator that includes a piezoelectric layer and an interdigital transducer electrode including a first layer disposed over the piezoelectric layer and a second layer disposed over the first layer, the second metal layer being of a more dense material than the first layer. A thickness of the second layer in a gap region of the interdigital transducer electrode is smaller than a thickness of the second layer in a center region of the interdigital transducer electrode to thereby reduce a mass loading of the interdigital transducer electrode in the gap region. The radio frequency module also comprises additional circuitry, the acoustic wave filter and additional circuitry disposed on the package substrate.

In accordance with another aspect of the disclosure, a wireless communication device is provided. The wireless communication device comprises an antenna and a front end module including an acoustic wave filter configured to filter a radio frequency signal associated with the antenna. The acoustic wave filter includes one or more acoustic wave devices that each include a piezoelectric layer and an interdigital transducer electrode including a first layer disposed over the piezoelectric layer and a second layer disposed over the first layer, the second layer being of a more dense material than the first layer. A thickness of the second layer in a gap region of the interdigital transducer electrode is smaller than a thickness of the second layer in a center region of the interdigital transducer electrode to thereby reduce a mass loading of the interdigital transducer electrode in the gap region.

In accordance with another aspect of the disclosure, a method of manufacturing an acoustic wave device is provided. The method comprises forming or providing a piezoelectric layer. The method also comprises forming or providing an interdigital transducer electrode over the piezoelectric layer, the interdigital transducer electrode including a first layer over the piezoelectric layer and a second layer over the first layer, the second layer being of a more dense material than the first layer. A thickness of the second layer in a gap region of the interdigital transducer electrode is smaller than a thickness of the second layer in a center region of the interdigital transducer electrode to thereby reduce a mass loading of the interdigital transducer electrode in the gap region.

In accordance with another aspect of the disclosure, an acoustic wave filter is provided. The acoustic wave filter comprises a piezoelectric layer. The acoustic wave filter also comprises a first acoustic wave device including a first portion of the piezoelectric layer and a first multi-layer interdigital transducer electrode disposed over the first portion of the piezoelectric layer. The acoustic wave filter also comprises a plurality of additional acoustic wave devices coupled to the first acoustic wave device, the plurality of additional acoustic wave devices including a second portion of the piezoelectric layer and a plurality of multi-layer interdigital transducer electrodes disposed over the second portion of the piezoelectric layer. At least one of the plurality of multi-layer interdigital transducer electrodes includes a metal layer that is thinner than a corresponding metal layer of the same material of the first multi-layer interdigital transducer electrode of the first acoustic wave device.

In accordance with another aspect of the disclosure, an acoustic wave filter is provided. The acoustic wave filter comprises an acoustic wave device including a first portion of a piezoelectric layer and a multi-layer interdigital transducer electrode disposed over the first portion of the piezoelectric layer. The acoustic wave filter also comprises a multi-mode surface acoustic wave filter coupled to the acoustic wave device, the multi-mode surface acoustic wave filter including a second portion of the piezoelectric layer and a plurality of multi-layer interdigital transducer electrodes disposed over the second portion of the piezoelectric layer and longitudinally coupled to each other. At least one of the plurality of multi-layer interdigital transducer electrodes includes a metal layer that is thinner than a corresponding metal layer of the same material of the multi-layer interdigital transducer electrode of the acoustic wave device.

In accordance with another aspect of the disclosure, a radio frequency module is provided. The radio frequency module comprises a package substrate and an acoustic wave filter configured to filter a radiofrequency signal. The acoustic wave filter includes a first acoustic wave device including a first portion of a piezoelectric layer and a first multi-layer interdigital transducer electrode disposed over the first portion of the piezoelectric layer. The acoustic wave filter also comprises a plurality of additional acoustic wave devices coupled to the first acoustic wave device. The plurality of additional acoustic wave devices include a second portion of the piezoelectric layer and a plurality of multi-layer interdigital transducer electrodes disposed over the second portion of the piezoelectric layer. At least one of the plurality of multi-layer interdigital transducer electrodes includes a metal layer that is thinner than a corresponding metal layer of the same material of the first multi-layer interdigital transducer electrode of the first acoustic wave device. The radio frequency module also comprises additional circuitry, the acoustic wave filter and additional circuitry disposed on the package substrate.

In accordance with another aspect of the disclosure, a wireless communication device is provided. The wireless communication device comprises an antenna and a front end module including an acoustic wave filter configured to filter a radio frequency signal associated with the antenna. The acoustic wave filter includes a first acoustic wave device including a first portion of a piezoelectric layer and a first multi-layer interdigital transducer electrode disposed over the first portion of the piezoelectric layer. The acoustic wave filter also includes a plurality of additional acoustic wave devices coupled to the first acoustic wave device. The plurality of additional acoustic wave devices include a second portion of the piezoelectric layer and a plurality of multi-layer interdigital transducer electrodes disposed over the second portion of the piezoelectric layer. At least one of the plurality of multi-layer interdigital transducer electrodes includes a metal layer that is thinner than a corresponding metal layer of the same material of the first multi-layer interdigital transducer electrode of the first acoustic wave device.

In accordance with another aspect of the disclosure, a method of manufacturing an acoustic wave filter is provided. The method comprises forming or providing a piezoelectric layer. The method also comprises forming or providing a first multi-layer interdigital transducer electrode over the first portion of the piezoelectric layer. The method also comprises forming or providing a plurality of multi-layer interdigital transducer electrodes over the second portion of the piezoelectric layer. At least one of the plurality of multi-layer interdigital transducer electrodes includes a metal layer that is thinner than a corresponding metal layer of the same material of the first multi-layer interdigital transducer electrode.

BRIEF DESCRIPTION OF THE DRAWINGS

Embodiments of this disclosure will now be described, by way of non-limiting example, with reference to the accompanying drawings.

FIG. 1A illustrates a cross-section of a surface acoustic wave (SAW) device including a multi-layer interdigital transducer electrode.

FIG. 1B is a top plan view of the surface acoustic wave device of FIG. 1A.

FIG. 1D illustrates a cross-sectional view of a surface acoustic wave (SAW) device including an interdigital transducer electrode.

FIG. 1E is a top plan view of the surface acoustic wave device of FIG. 1D.

FIG. 11A illustrates an IDT with fingers having hammer head shaped end portions. FIG. 11B illustrates an IDT with thicker portions for both border regions of each finger. FIG. 11C illustrates an IDT with fingers having hammer head shaped end portions and bus bars having extension portions adjacent to the end portions of the fingers. FIG. 11D illustrates an IDT with thicker end portions on border regions of each finger and bus bars having extension portions adjacent to end portions of the fingers. FIG. 11E illustrates an IDT with fingers having thicker end portions and thicker regions extending from a bus bar toward an active region. FIG. 11H illustrates an IDT with a disconnected second narrow busbar and FIG. 11I illustrates a cross-section of a surface acoustic wave (SAW) device including the IDT of FIG. 11H. FIG. 11J illustrates an IDT with a floating mass loading strip and FIG. 11K illustrates a cross-section of a surface acoustic wave (SAW) device including the IDT of FIG. 11J.

DETAILED DESCRIPTION OF CERTAIN EMBODIMENTS

Figure 1C:
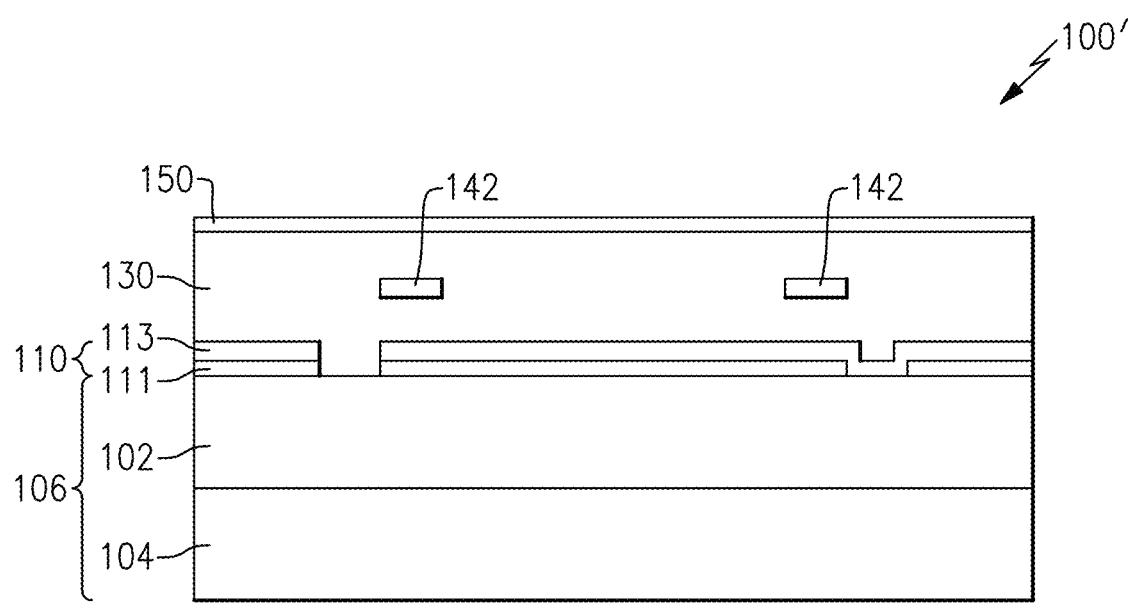
FIG. 1C illustrates a cross-section of a surface acoustic wave (SAW) device including a multi-layer piezoelectric substrate.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) resonators. The speed at which an acoustic wave will propagate within a SAW resonator is a function of a variety of factors, including the thicknesses of the various components and the density of the materials used to form the various components.

A plurality of resonators may be formed on a single wafer, including filter components of different types. For example, a single wafer may include one or more multi-mode SAW filters, in addition to one or more SAW resonators. These components may have different design, but may share common manufacturing steps, and may therefore share common constituent layers. The use of thicker layers and/or denser materials in an interdigital transducer (IDT) electrode of a SAW resonator can slow the propagation of acoustic waves within the SAW resonators, allowing the SAW resonators to be made more compact. However, the use of these thicker layers or denser materials in IDT electrodes may not be suitable for use in the longitude coupled multi-mode SAW filters.

Aspects of this disclosure relate to the reduction in side leakage in a SAW device by reducing the mass loading in the gap region, such as by replacing a heavy or denser material of the IDT with a lighter or less dense material.

FIG. 1A illustrates a cross-section of a surface acoustic wave (SAW) resonator including a multilayer interdigital transducer electrode. FIG. 1B is a top plan view of the surface acoustic wave resonator of FIG. 1A. The illustrated SAW resonator 100 in includes a piezoelectric layer 102. In some embodiments, the piezoelectric layer 102 may include a material such as lithium tantalate (LT) or lithium niobate (LN), although other suitable materials may also be used.

The SAW resonator 100 also includes an interdigital transducer (IDT) electrode 110. The IDT electrode 110 can include any suitable IDT electrode material. In the illustrated embodiment, the IDT electrode 110 is a multi-layer IDT electrode that includes separate IDT electrode layers that impact acoustic properties (e.g., IDT sublayer with more dense material, such as tungsten (W)) and electrical properties (e.g., IDT sublayer with less dense material, such as Aluminum (Al)), respectively. The IDT electrode 110 includes a first IDT sublayer 111 and a second IDT sublayer 113. In some embodiments the first IDT sublayer 111 can be of a material with a higher density than the material of the second IDT sublayer 113. In some embodiments, the first IDT sublayer 111 may include tungsten (W) and the second IDT sublayer 113 may include Aluminum (Al). Other suitable materials can be used for the first IDT sublayer 111 and/or second IDT sublayer 113, such as Aluminum (Al) copper (Cu), Magnesium (Mg), tungsten (W), titanium (Ti), or other suitable materials, as well as any suitable combination thereof. In some embodiments, the IDT electrode 110 may include alloys, such as AlMgCu, AlCu, etc. For example, the first IDT sublayer 111 may include molybdenum (Mo).

A temperature compensation layer 130 is located over the IDT electrode 110. In some embodiments, the temperature compensation layer 130 may include a layer of silicon dioxide (SiO2) or other silica oxide-based material, although other suitable materials may also be used. In the SAW resonator 100 the temperature compensation layer 130 can bring a temperature coefficient of frequency (TCF) of the SAW resonator 100 closer to zero. The temperature compensation layer 130 can have a positive TCF. This can compensative for a negative TCF of the piezoelectric layer 102, as various piezoelectric layers such as lithium niobate and lithium tantalate have a negative TCF. A passivation layer 150 is located over the temperature compensation layer 130. The passivation layer 150 may include, for example, a layer of silicon nitride (SiN) or a layer of silicon oxynitride (SiON), although other suitable materials may also be used.

In the illustrated embodiment, strips 142 (e.g., mass loading strips, metal strips, such as high density metal strips of any suitable metal with a density equal to or greater than a layer of the IDT electrode 110) are located over edge regions of the IDT 110 electrode. As can be seen in FIG. 1B, the IDT electrode 110 can include a bus bar 112 and fingers 114 that extend from the bus bar 112 toward the opposite bus bar, with a gap portion or region 118 located between the ends of the fingers 114 and the opposite bus bar. The gap portions 118 can have a width $W_2$. In some embodiments the gap portions 118 may have a width of about 0.9 k, although other suitable widths may also be used. The fingers 114 of the IDT electrode 110 have an active region. The active region can be a region between the gap portions 118. This region can be referred to as an aperture 126, having a width $W_3$. The edge portions 124 on either side of a central region 128 of the active region or aperture 126 have widths $W_1$. In some embodiments the edge portions 124 may have a width of about 0.5 to 1.5λ, although other suitable widths may also be used. The strips 142 can overlie edge portions of fingers 114 of the IDT electrode 110 as illustrated, and can have the same width $W_1$ as the edge portions 124.

In the illustrated embodiment, the first IDT sublayer 111 has a thickness $T_2$, the second IDT sublayer 113 has a thickness $T_3$, and the temperature compensation layer 130 has a thickness of $T_1$ within the gap regions 118. In some embodiments, the thickness $T_2$ may be between about 0.02λ and 0.1λ, although other thicknesses may also be used. In some embodiments, the thickness $T_3$ may be between about 0.02λ and 0.1λ, although other thicknesses may also be used. In some embodiments, the thickness $T_1$ of the temperature compensation layer 130 may be between about 0.2λ and 0.5λ, although other thicknesses may also be used.

With continued reference to FIG. 1A, the IDT 110 has reduced mass loading in the gap portion or region 118. As illustrated in FIG. 1A, in one implementation the first IDT sublayer 111 is removed (e.g., completely removed) in the gap region 118 and filled by the material of the second IDT sublayer 113, where the material of the second IDT sublayer 113 is less dense than the material of the first IDT sublayer 111. Therefore, in one implementation, there is only one IDT layer in the gap region 118 (e.g., the second IDT sublayer 113). In another implementation, some but less than all (e.g., ½) of the material of the first IDT sublayer 111 is removed in the gap region 118 so that the first IDT sublayer 111 is thinner in the gap region 118 relative to other portions of the first IDT sublayer 111. The thickness of the IDT 110 in the gap region 118 is smaller relative to other portions of the IDT 110. As further described below, the IDT 110 can be formed by first applying the first IDT sublayer 111, then removing (e.g., etching) some or all of the material of the first IDT sublayer 111 in the gap region 118. Then the second IDT sublayer 113 is applied. Advantageously, removing at least some (e.g., ½, removing all) of the first IDT sublayer 111 in the gap region 118 so that the second IDT sublayer 113 provides the majority (e.g., all) of the IDT material in the gap region 118 reduces mass loading in the gap region 118 to inhibit (e.g., reduce) Q degradation from resonant frequency (e.g., as a result of edge shear horizontal mode radiation).

FIG. 1C illustrates a cross-section of a surface acoustic wave resonator including a multi-layer piezoelectric substrate. The SAW resonator 100' of FIG. 1C is similar to the SAW resonator 100 in FIGS. 1A-1B. Thus, reference numerals used to designate the various components of the SAW resonator 100' are identical to those used for identifying the corresponding components of the SAW resonator 100 in FIGS. 1A-1B. Therefore, the structure and description above for the various features of the SAW resonator 100 in FIGS. 1A-1B are understood to also apply to the corresponding features of the SAW resonator 100' in FIG. 1C, except as described below.

The SAW resonator 100' includes a multilayer piezoelectric substrate 106, including a support substrate 104 in addition to the piezoelectric substrate 102. The support substrate 104 may include silicon (Si) in some embodiments, although other suitable materials may also be used, including but not limited to sapphire, aluminum oxide ($Al_2O_3$), aluminum nitride (AlN), or ceramic materials. Although the multilayer piezoelectric substrate 106 is illustrated as including two layers, one or more additional layers may also be included. For example, in some embodiments, the multilayer piezoelectric substrate may include a functional layer, such as an $SiO_2$ layer, between the piezoelectric substrate 102 and the support substrate 104. A multi-layer piezoelectric substrate can be implemented in accordance with any suitable principles and advantages disclosed herein.

FIG. 1D illustrates a cross-section of a surface acoustic wave (SAW) resonator 100" including a multilayer interdigital transducer electrode. FIG. 1E is a top plan view of the surface acoustic wave resonator of FIG. 1D. The illustrated SAW resonator 100" is similar to the SAW resonator 100 in FIGS. 1A-1B. Thus, reference numerals used to designate the various components of the SAW resonator 100" are identical to those used for identifying the corresponding components of the SAW resonator 100 in FIGS. 1A-1B. Therefore, the structure and description above for the various features of the SAW resonator 100 in FIGS. 1A-1B are understood to also apply to the corresponding features of the SAW resonator 100" in FIG. 1D-1E, except as described below.

The SAW resonator 100" differs from the SAW resonator 100 in that the bus bars 112 of the IDT 110 each include extension portions, such as extension portion 119, in the gap region 118 that are spaced from end portions of fingers 114 of the IDT 110. The extension portions 119 can be dummy electrodes. As shown in FIG. 1D, the extension portions 119 are formed by the first IDT sublayer 111 (e.g., but not the second IDT sublayer 113).

Figure 2:
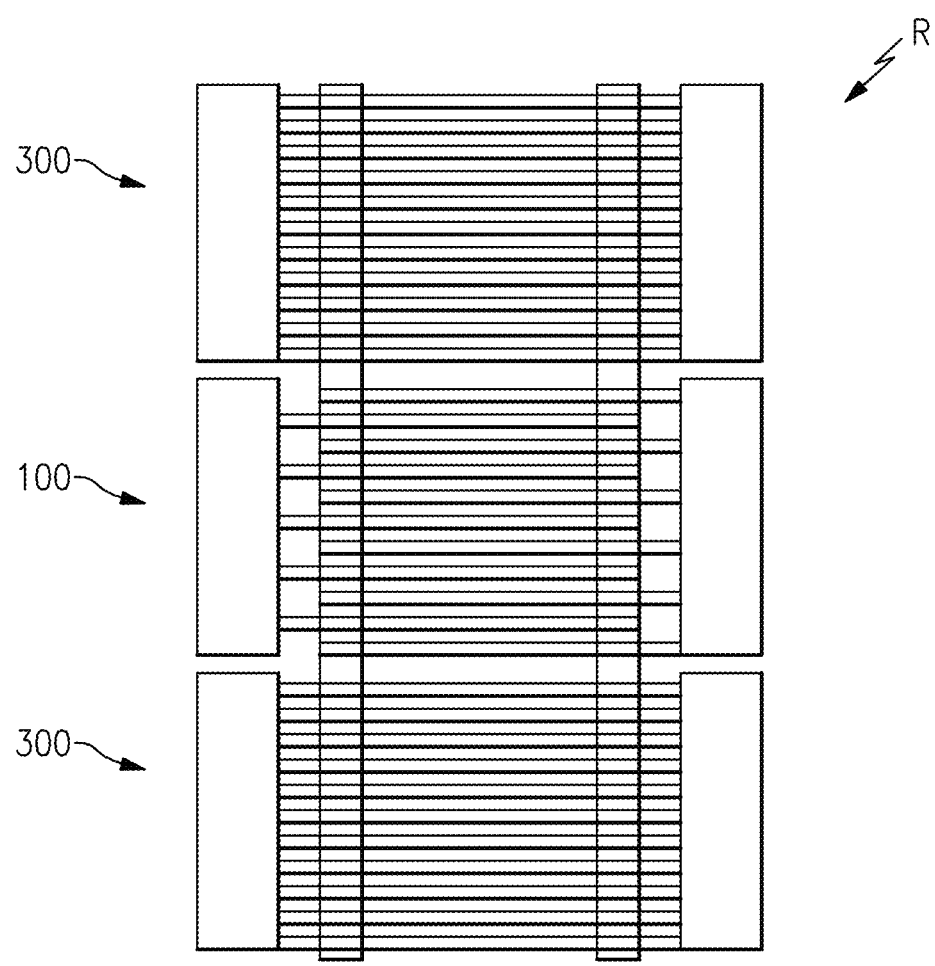
FIG. 2 is a top plan view of a resonator incorporating the surface acoustic wave device of FIGS. 1A-1B.

FIG. 2 illustrates a top plan view of a resonator R incorporating the surface acoustic wave device 100 (e.g., of FIGS. 1A-1B) between a pair of acoustic reflectors 300. The acoustic reflectors 300 are separated from the IDT electrode 110 of the SAW device 100 by respective gaps. In other implementations, the resonator R can instead have the SAW device 100' of FIG. 1C or SAW device 100" of FIGS. 1D-1E between the acoustic reflectors 300.

Figure 3:
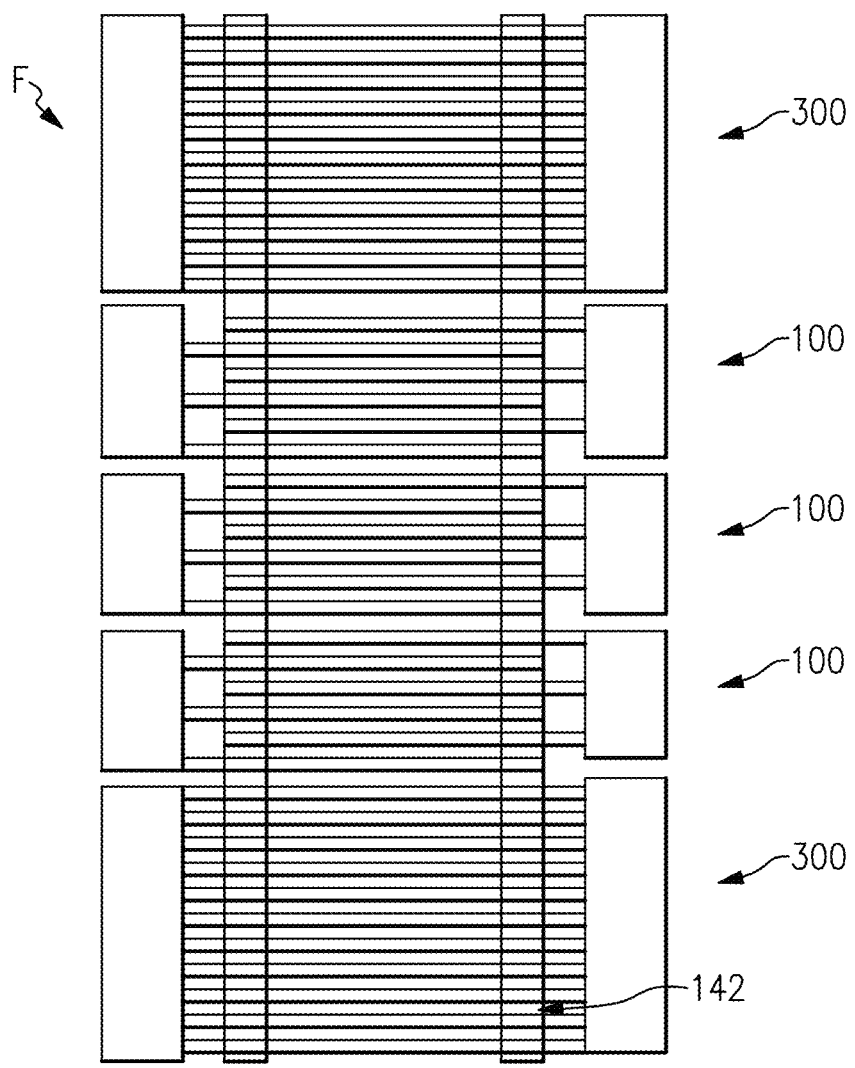
FIG. 3 is a top plan view of a multi-mode surface acoustic wave filter incorporating the surface acoustic wave device of FIGS. 1A-1B.

FIG. 3 illustrates a top plan view of a multi-mode surface acoustic wave filter F incorporating the surface acoustic wave device 100 (e.g., of FIGS. 1A-1B). In the illustrated implementation, the filter F has three SAW devices 100 (e.g., arranged sequentially) between a pair of acoustic reflectors 300. The SAW device 100 can be spaced from each other by a gap. The acoustic reflectors 300 are separated from the IDT electrode 110 of its adjacent SAW device 100 by respective gaps. In other implementations, the multi-mode SAW filter F can instead have one or more SAW devices 100' of FIG. 1C or one or more SAW devices 100" of FIGS. 1D-1E between the acoustic reflectors 300. In the illustrated implementation, the strips 142 (e.g., mass loading strips) extend past the edge of the fingers of the IDT. In another implementation, the strips 142 (e.g., mass loading strips) do not extend past the edge of the fingers of the IDT; for example, the end edge of the strips 142 can align with the edge of the fingers of the IDT. In the illustrated implementation, the strips 142 (e.g., mass loading strips) extend over the entirety of the reflectors 300. In other implementations, the strips 142 can extend over a portion of (but less than all of) the reflectors 300. In another implementation, the strips 142 do not extend over the reflectors 300.

Figure 4C:
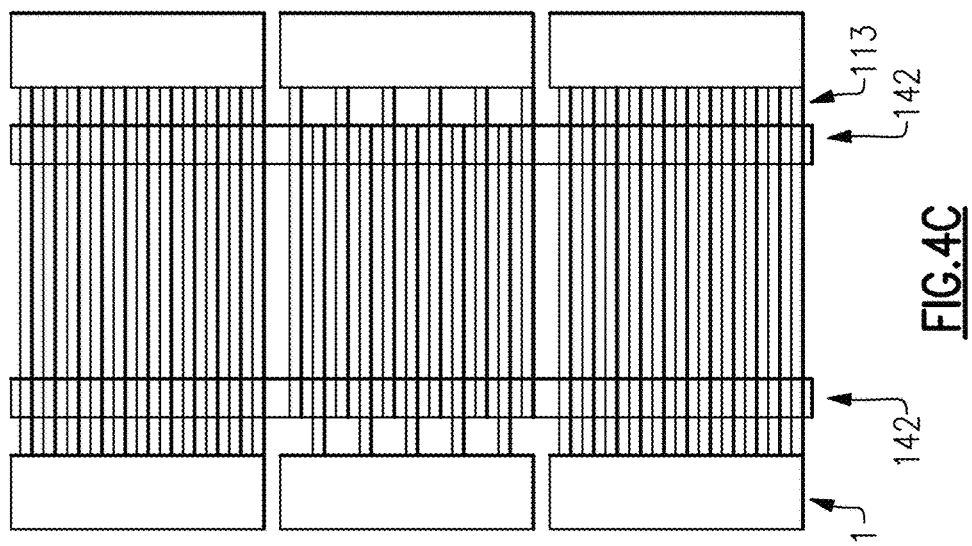
FIG. 4C is an illustration of another step in a process of making the resonator of FIG. 2.
Figure 4B:
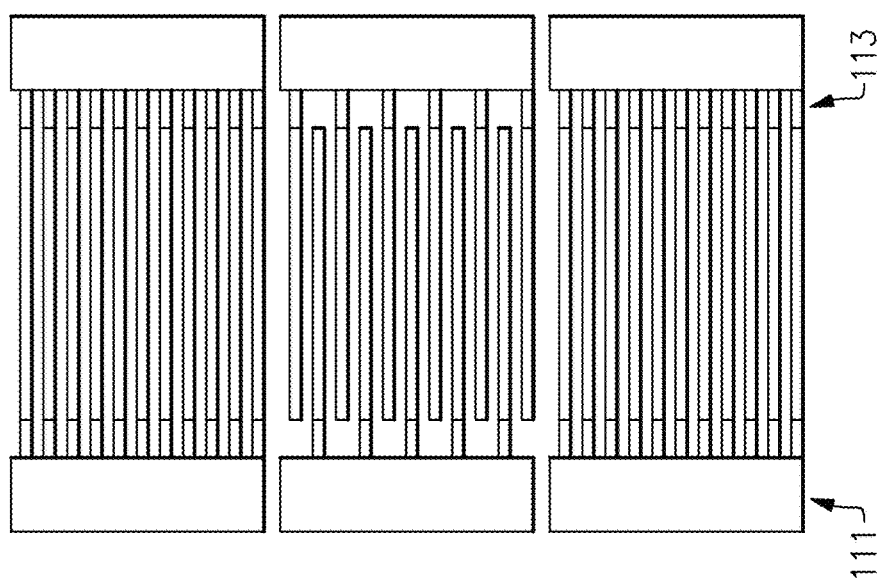
FIG. 4B is an illustration of another step in a process of making the resonator of FIG. 2.
Figure 4A:
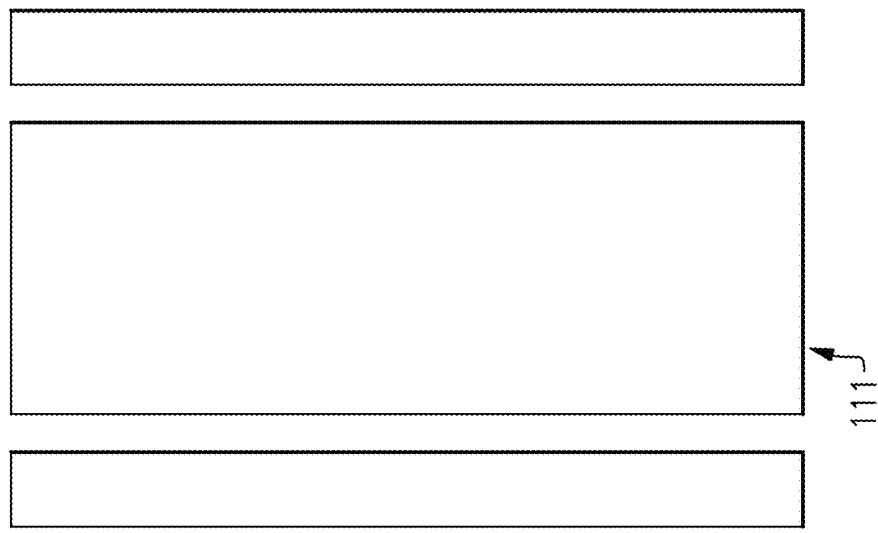
FIG. 4A is an illustration of one step in a process of making the resonator of FIG. 2.

FIGS. 4A-4C show steps in a process for making the IDT of the resonator R (e.g., in FIG. 2). As shown in FIG. 4A, the first IDT sublayer 111 is applied (e.g., deposited), for example, over the piezoelectric layer 102 and patterned. In one example, the first IDT sublayer 111 can be made of tungsten (W). As shown in FIG. 4B, the second IDT sublayer 113 is applied (e.g., deposited), for example, on the first IDT sublayer 111 and the first and second IDT sublayers 111, 113 are patterned to define the IDT structure of the SAW device 100 and the acoustic reflectors 300. In one example, the second IDT sublayer 113 can be made of Aluminum (Al). As shown in FIG. 4C, the piston mode layer or strips (e.g., mass loading strips) 142 can then be applied over the edge regions of the IDT 110 and patterned.

Figures 5A, 5B:
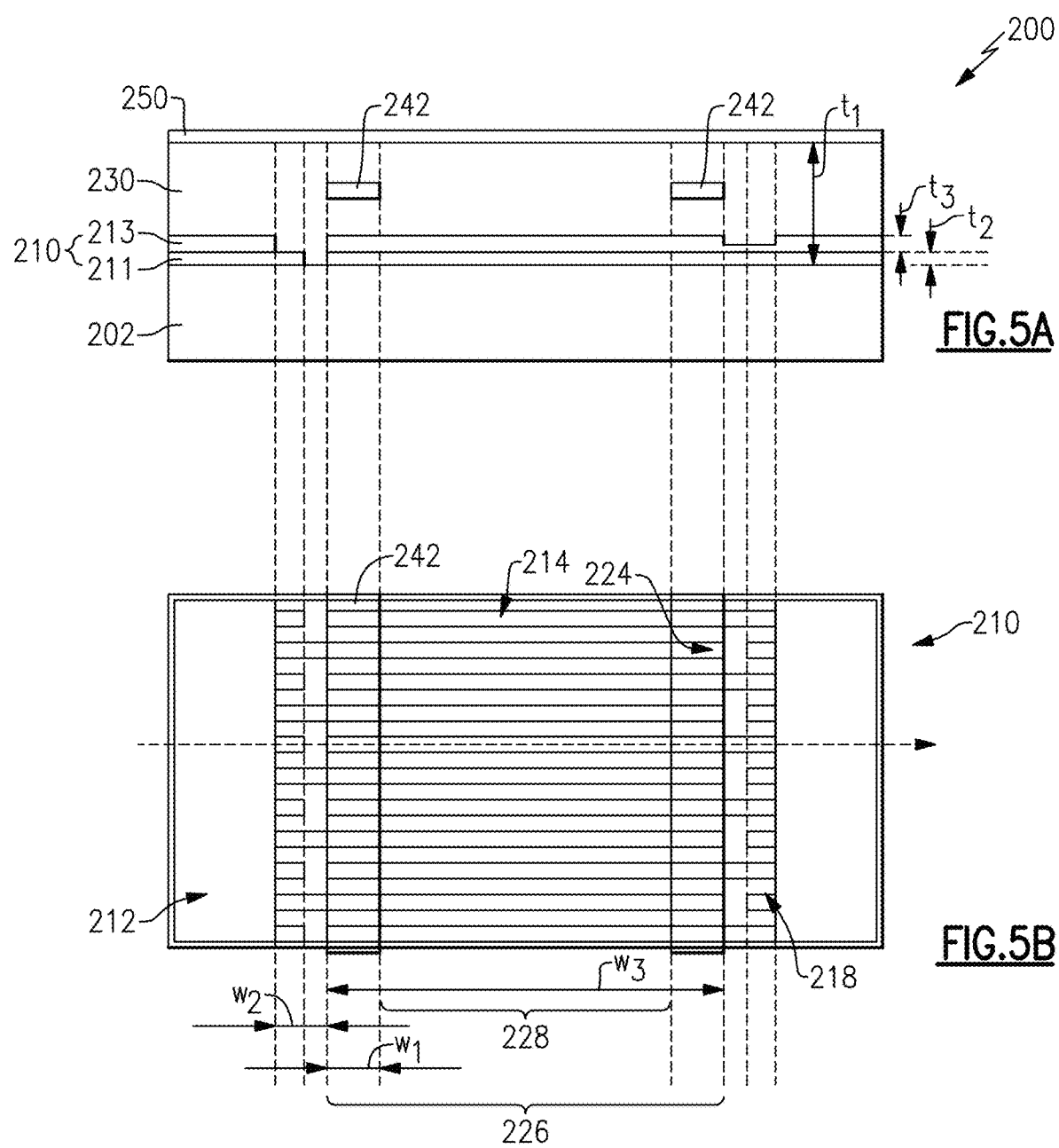
FIG. 5A illustrates a cross-section of a surface acoustic wave (SAW) device including a multi-layer interdigital transducer electrode.
FIG. 5B is a top plan view of the surface acoustic wave device of FIG. 5A.

FIG. 5A illustrates a cross-section of a surface acoustic wave (SAW) resonator including a multilayer interdigital transducer electrode. FIG. 5B is a top plan view of the surface acoustic wave resonator of FIG. 5A. The illustrated SAW resonator 200 in includes a piezoelectric layer 202. In some embodiments, the piezoelectric layer 202 may include a material such as lithium tantalate (LT) or lithium niobate (LN), although other suitable materials may also be used.

The SAW resonator 200 also includes an interdigital transducer (IDT) electrode 210. The IDT electrode 210 can include any suitable IDT electrode material. In the illustrated embodiment, the IDT electrode 210 includes a first IDT sublayer 211 and a second IDT sublayer 213. In some embodiments the first IDT sublayer 211 can be of a material with a lower density than the material of the second IDT sublayer 213. In some embodiments, the first IDT sublayer 211 may include Aluminum (Al) and the second IDT sublayer 213 may include tungsten (W). Other suitable materials can be used for the first IDT sublayer 211 and/or second IDT sublayer 213, such as Aluminum (Al) copper (Cu), Magnesium (Mg), tungsten (W), titanium (Ti), or other suitable materials, as well as any suitable combination thereof. In some embodiments, the IDT electrode 210 may include alloys, such as AlMgCu, AlCu, etc. For example, the second IDT sublayer 213 may include molybdenum (Mo).

A temperature compensation layer 230 is located over the IDT electrode 210. In some embodiments, the temperature compensation layer 230 may include a layer of silicon dioxide (SiO2) or other silica oxide-based material, although other suitable materials may also be used. In the SAW resonator 200 the temperature compensation layer 230 can bring a temperature coefficient of frequency (TCF) of the SAW resonator 200 closer to zero. The temperature compensation layer 230 can have a positive TCF. This can compensative for a negative TCF of the piezoelectric layer 202, as various piezoelectric layers such as lithium niobate and lithium tantalate have a negative TCF. A passivation layer 250 is located over the temperature compensation layer 230. The passivation layer 250 may include, for example, a layer of silicon nitride (SiN) or a layer of silicon oxynitride (SiON), although other suitable materials may also be used.

In the illustrated embodiment, strips 242 (e.g., mass loading strips, metal strips, such as high density metal strips of any suitable metal with a density equal to or greater than a layer of the IDT electrode 210) are located over edge regions of the IDT 210 electrode. As can be seen in FIG. 5B, the IDT electrode 210 can include a bus bar 212 and fingers 214 that extend from the bus bar 212 toward the opposite bus bar, with a gap portion or region 218 located between the ends of the fingers 214 and the opposite bus bar. The gap portions 218 can have a width $W_2$. In some embodiments the gap portions 218 may have a width of about 0.9λ, although other suitable widths may also be used. The fingers 214 of the IDT electrode 210 have an active region. The active region can be a region between the gap portions 218. This region can be referred to as an aperture 226, having a width $W_3$. The edge portions 224 on either side of a central region 228 of the active region or aperture 126 have widths $W_1$. In some embodiments the edge portions 224 may have a width of about 0.5 to 1.5λ, although other suitable widths may also be used. The strips 142 can overlie edge portions of fingers 214 of the IDT electrode 210 as illustrated, and can have the same width $W_1$ as the edge portions 224.

In the illustrated embodiment, the first IDT sublayer 211 has a thickness $T_2$, the second IDT sublayer 213 has a thickness $T_3$, and the temperature compensation layer 230 has a thickness of $T_1$ within the gap regions 218. The first IDT sublayer 211 includes extensions from the bus bar 212 or dummy electrodes that extend into the gap region 218 and are spaced from end portions of the fingers 214. In some embodiments, the thickness $T_2$ may be between about 0.02λ and 0.1λ, although other thicknesses may also be used. In some embodiments, the thickness $T_3$ may be between about 0.02λ and 0.1λ, although other thicknesses may also be used. In some embodiments, the thickness $T_1$ of the temperature compensation layer 230 may be between about 0.2λ and 0.5λ, although other thicknesses may also be used.

With continued reference to FIG. 5A, the IDT 210 has reduced mass loading in the gap portion or region 218. As illustrated in FIG. 5A, in one implementation the second IDT sublayer 213 is removed (e.g., partially removed, completely removed) in the gap region 218, where the material of the second IDT sublayer 213 is more dense than the material of the first IDT sublayer 211. Therefore, in one implementation, there is only one IDT layer in the gap region 218 (e.g., the first IDT sublayer 213). In another implementation, some but less than all (e.g., ½, ¼) of the material of the second IDT sublayer 213 is removed in the gap region 218 so that the second IDT sublayer 213 is thinner in the gap region 218 relative to other portions of the second IDT sublayer 213. In one implementation, a stop layer (e.g., of titanium (Ti) or titanium nitride (TiN)) can be included between the first IDT sublayer 211 and second IDT sublayer 213 to inhibit (e.g., prevent) removal (e.g., etching) of the first IDT sublayer 211 in the gap region 218 when the second IDT sublayer 213 is removed (e.g., etched) in the gap region 218. Such a stop layer would have no significant impact on performance of the SAW resonator 200 and aid in the manufacture thereof. The thickness of the IDT 210 in the gap region 218 is smaller relative to other portions of the IDT 210. As further described below, the IDT 210 can be formed by first applying the first IDT sublayer 211, then applying the second IDT sublayer 213, then removing (e.g., etching) some or all of the material of the second IDT sublayer 213 in the gap region 218. Advantageously, removing at least some (e.g., ½, ¾, removing all) of the second IDT sublayer 213 in the gap region 218 so that the first IDT sublayer 211 provides the majority (e.g., all) of the IDT material in the gap region 218 reduces mass loading in the gap region 218 to inhibit (e.g., reduce) Q degradation from resonant frequency (e.g., as a result of edge shear horizontal mode radiation).

Figure 5C:
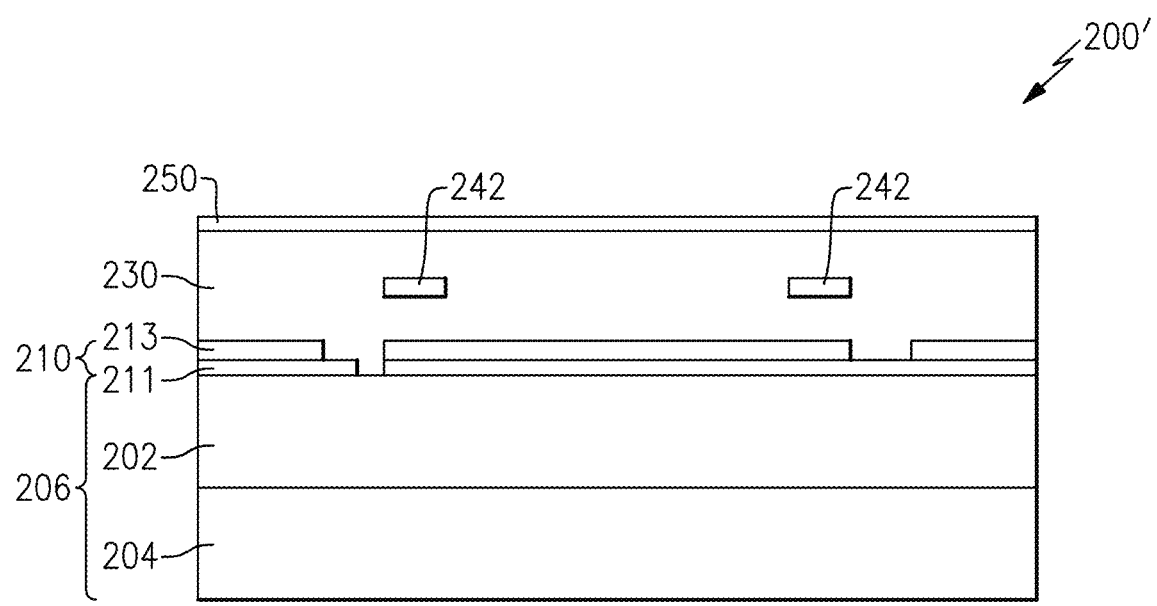
FIG. 5C illustrates a cross-section of a surface acoustic wave (SAW) device including a multi-layer piezoelectric substrate.

FIG. 5C illustrates a cross-section of a surface acoustic wave resonator including a multi-layer piezoelectric substrate. The SAW resonator 200' of FIG. 5C is similar to the SAW resonator 200 in FIGS. 5A-5B. Thus, reference numerals used to designate the various components of the SAW resonator 200' are identical to those used for identifying the corresponding components of the SAW resonator 200 in FIGS. 5A-5B, unless otherwise noted, except that a "'" is added to the numerical identifier. Therefore, the structure and description above for the various features of the SAW resonator 200 in FIGS. 5A-5B are understood to also apply to the corresponding features of the SAW resonator 200' in FIG. 5C, except as described below.

The SAW resonator 200' includes a multilayer piezoelectric substrate 206, including a support substrate 204 in addition to the piezoelectric substrate 202. The support substrate 204 may include silicon (Si) in some embodiments, although other suitable materials may also be used, including but not limited to sapphire, aluminum oxide ($Al_2O_3$), aluminum nitride (AlN), or ceramic materials. Although the multilayer piezoelectric substrate 206 is illustrated as including two layers, one or more additional layers may also be included. For example, in some embodiments, the multilayer piezoelectric substrate may include a functional layer, such as an $SiO_2$ layer, between the piezoelectric substrate 202 and the support substrate 204. A multi-layer piezoelectric substrate can be implemented in accordance with any suitable principles and advantages disclosed herein. Additionally, the second IDT sublayer 213 is completely removed (e.g., etched) in the gap region 218. In another implementation, the second IDT sublayer 213 is completely removed (e.g. etched) in the gap region 218 and at least a portion of the first IDT sublayer 211 is removed (e.g., etched) in the gap region 218.

Figures 5D, 5E:
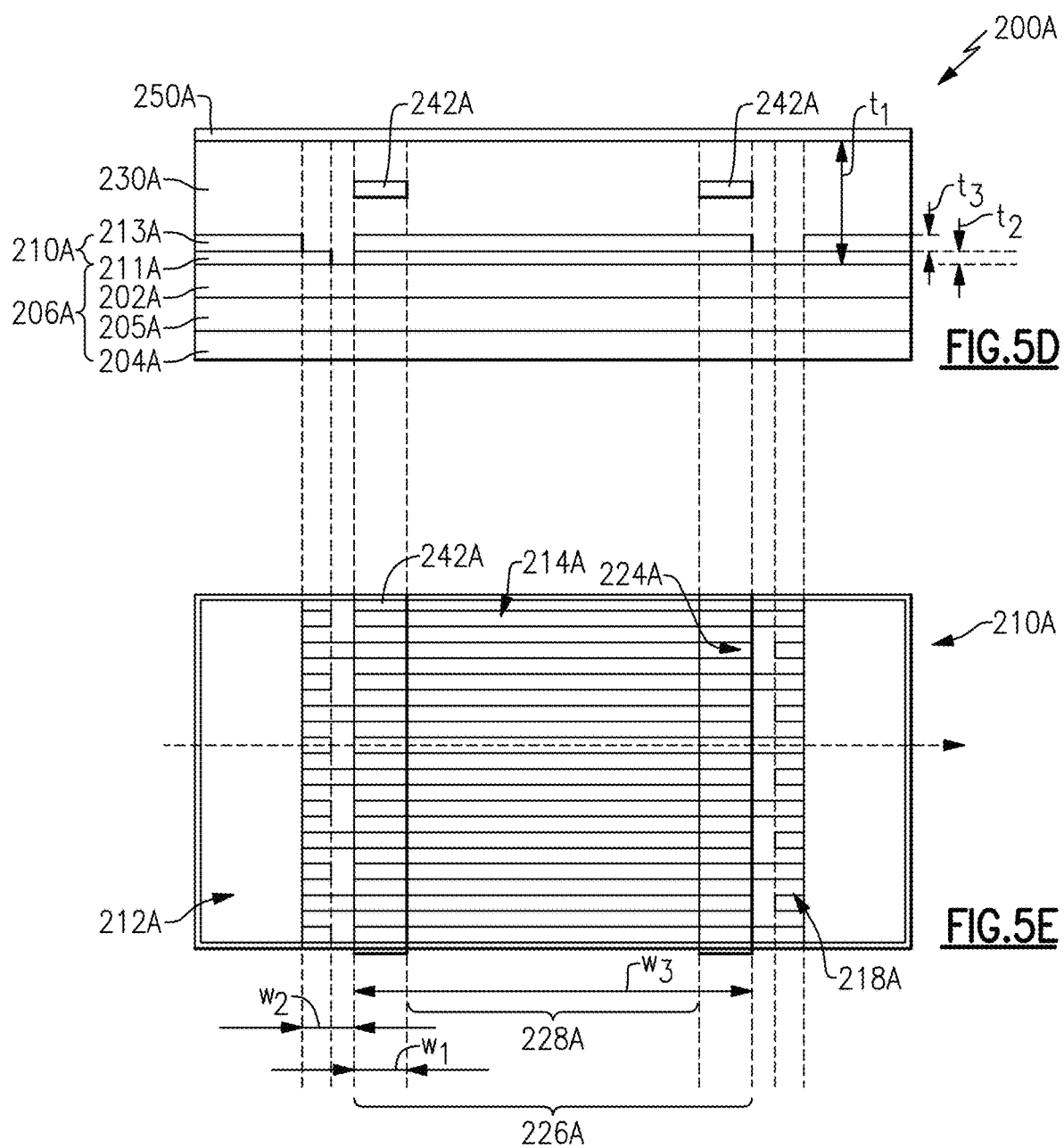
FIG. 5D illustrates a cross-section of a surface acoustic wave (SAW) device including a multi-layer interdigital transducer electrode.
FIG. 5E is a top plan view of the surface acoustic wave device of FIG. 5D.

FIG. 5D illustrates a cross-section of a surface acoustic wave resonator including a multi-layer piezoelectric substrate. FIG. 5E is a top plan view of the surface acoustic wave resonator of FIG. 5D. The SAW resonator 200A of FIGS. 5D-5E is similar to the SAW resonator 200 in FIGS. 5A-5B. Thus, reference numerals used to designate the various components of the SAW resonator 200A are identical to those used for identifying the corresponding components of the SAW resonator 200 in FIGS. 5A-5B, except that an "A" is added to the numerical identifier. Therefore, the structure and description above for the various features of the SAW resonator 200 in FIGS. 5A-5B are understood to also apply to the corresponding features of the SAW resonator 200A in FIGS. 5D-5E, except as described below.

The SAW resonator 200A includes a multilayer piezoelectric substrate 206A, including a support substrate 204A disposed under the piezoelectric substrate 202A, with an additional layer 205A (e.g., functional layer) interposed between the support substrate 204A and the piezoelectric substrate 202A. The support substrate 204A may include silicon (Si) in some embodiments, although other suitable materials may also be used, including but not limited to sapphire, aluminum oxide ($Al_2O_3$), aluminum nitride (AlN), or ceramic materials. In one implementation, the piezoelectric substrate 202A may include lithium niobate (LN). The additional layer 205A can be a low impedance layer that has a lower acoustic impedance than the support substrate 204A. In some implementations, the additional layer 205A can include a silicon dioxide ($SiO_2$) layer. The additional layer 205A can increase adhesion between layers 202A, 204A of the multi-layer piezoelectric substrate 206A. Alternatively or additionally, the additional layer 205A can increase heat dissipation in the SAW device 200A relative to the SAW device 200, 200'. Although the multilayer piezoelectric substrate 206A is illustrated as including three layers, more or fewer layers may be included. A multi-layer piezoelectric substrate can be implemented in accordance with any suitable principles and advantages disclosed herein. Additionally, the second IDT sublayer 213 is completely removed (e.g., etched) in the gap region 218.

Figure 5F:
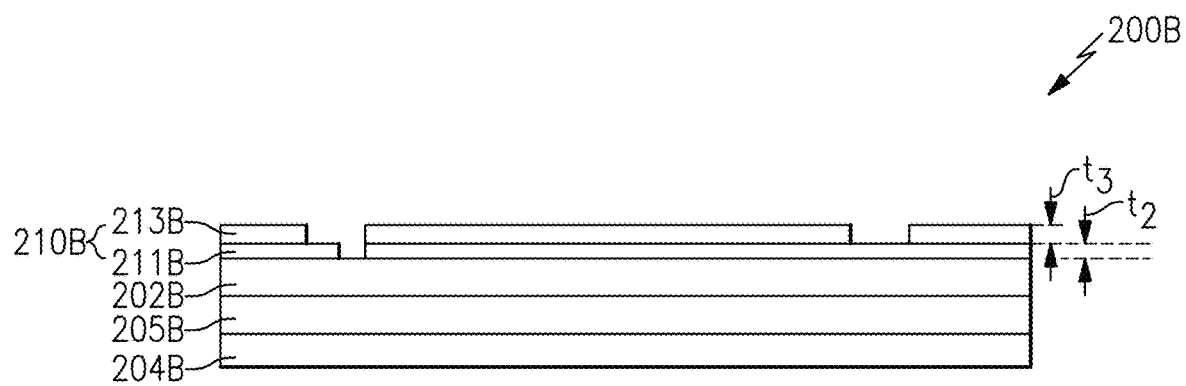
FIG. 5F illustrates a cross-section of a surface acoustic wave (SAW) device including a multi-layer interdigital transducer electrode.

FIG. 5F illustrates a cross-section of a surface acoustic wave resonator including a multi-layer piezoelectric substrate. The SAW resonator 200B of FIG. 5F is similar to the SAW resonator 200A in FIGS. 5D-5E. Thus, reference numerals used to designate the various components of the SAW resonator 200B are identical to those used for identifying the corresponding components of the SAW resonator 200A in FIGS. 5D-5E, unless otherwise noted, except that a "B" is added to the numerical identifier. Therefore, the structure and description above for the various features of the SAW resonator 200A in FIGS. 5D-5E are understood to also apply to the corresponding features of the SAW resonator 200B in FIG. 5F, except as described below.

The SAW resonator 200B differs from the SAW resonator 200A in that the temperature compensation layer (e.g., temperature compensation layer 230A), passivation layer (e.g., passivation layer 230A) and strips (e.g., mass loading strips 242A) are excluded. The multilayer piezoelectric substrate 206B includes a support substrate 204B disposed under the piezoelectric substrate 202B, with an additional layer 205B (e.g., functional layer) interposed between the support substrate 204B and the piezoelectric substrate 202B. The support substrate 204B may include silicon (Si) in some embodiments, although other suitable materials may also be used, including but not limited to sapphire, aluminum oxide ($Al_2O_3$), aluminum nitride (AlN), or ceramic materials. In one implementation, the piezoelectric substrate 202B may include lithium tantalate (LT). The additional layer 205B can be a low impedance layer that has a lower acoustic impedance than the support substrate 204B. In some implementations, the additional layer 205B can include a silicon dioxide ($SiO_2$) layer. The additional layer 205B can increase adhesion between layers 202B, 204B of the multi-layer piezoelectric substrate 206B. Alternatively or additionally, the additional layer 205B can increase heat dissipation in the SAW device 200B relative to the SAW device 200, 200'. Although the multilayer piezoelectric substrate 206B is illustrated as including three layers, more or fewer layers may be included. A multi-layer piezoelectric substrate can be implemented in accordance with any suitable principles and advantages disclosed herein.

Figure 5G:
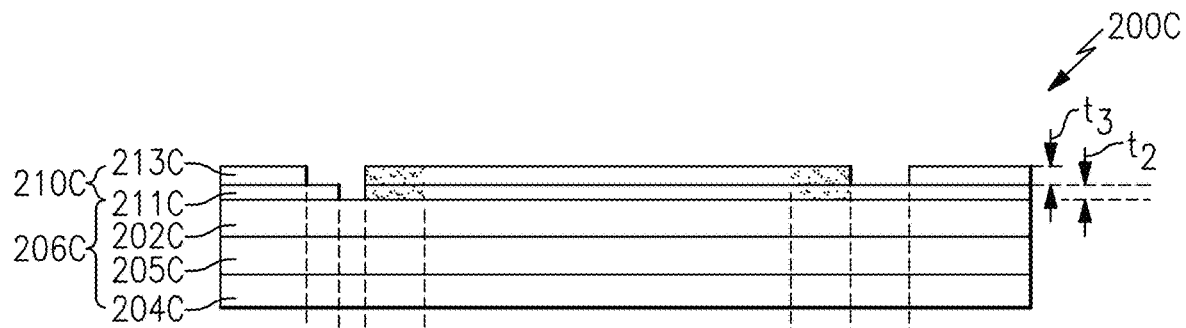
FIG. 5G illustrates a cross-section of a surface acoustic wave (SAW) device including a multi-layer interdigital transducer electrode.
Figure 5H:
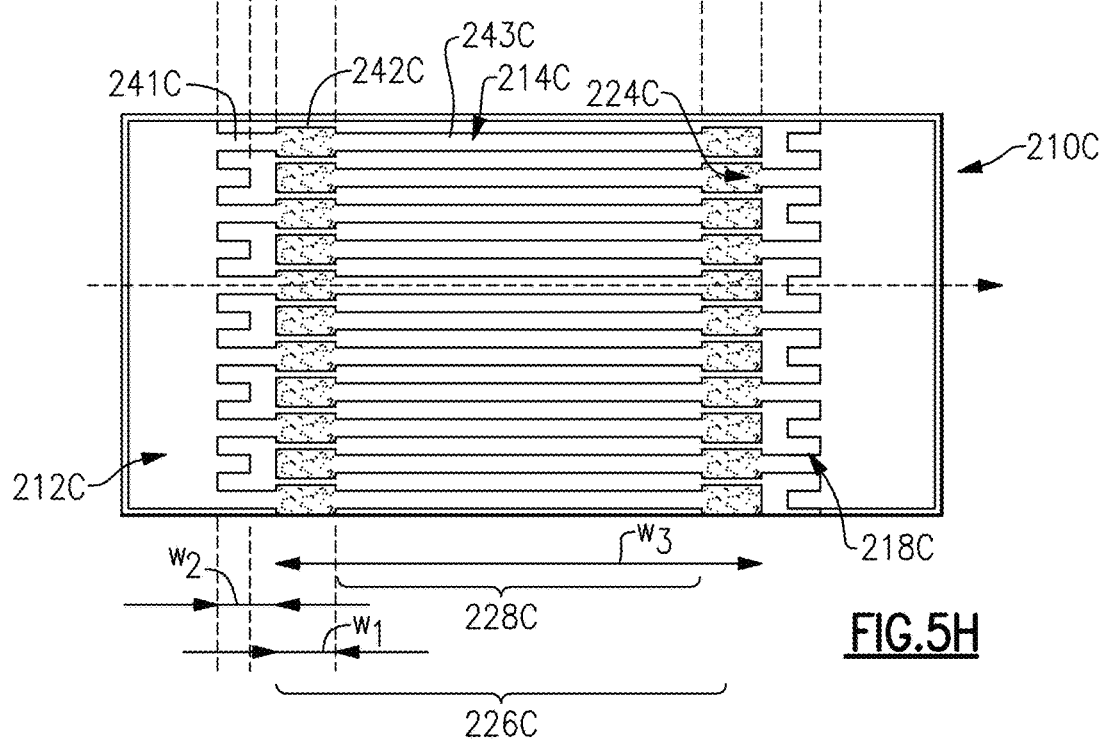
FIG. 5H is a top plan view of the surface acoustic wave device of FIG. 5G.

FIG. 5G illustrates a cross-section of a surface acoustic wave resonator including a multi-layer piezoelectric substrate. FIG. 5H is a top plan view of the surface acoustic wave resonator of FIG. 5G. The SAW resonator 200C of FIGS. 5G-5H is similar to the SAW resonator 200A in FIGS. 5D-5E. Thus, reference numerals used to designate the various components of the SAW resonator 200B are identical to those used for identifying the corresponding components of the SAW resonator 200A in FIGS. 5D-5E, unless otherwise noted, except that a "C" is added to the numerical identifier. Therefore, the structure and description above for the various features of the SAW resonator 200A in FIGS. 5D-5E are understood to also apply to the corresponding features of the SAW resonator 200C in FIGS. 5G-5H, except as described below.

The SAW resonator 200C differs from the SAW resonator 200A in that the temperature compensation layer (e.g., temperature compensation layer 230A), passivation layer (e.g., passivation layer 230A) and strips (e.g., mass loading strips 242A) are excluded. The multilayer piezoelectric substrate 206C includes a support substrate 204C disposed under the piezoelectric substrate 202C, with an additional layer 205C (e.g., functional layer) interposed between the support substrate 204C and the piezoelectric substrate 202C. The support substrate 204C may include silicon (Si) in some embodiments, although other suitable materials may also be used, including but not limited to sapphire, aluminum oxide ($Al_2O_3$), aluminum nitride (AlN), or ceramic materials. In one implementation, the piezoelectric substrate 202C may include lithium tantalate (LT). The additional layer 205C can be a low impedance layer that has a lower acoustic impedance than the support substrate 204C. In some implementations, the additional layer 205C can include a silicon dioxide ($SiO_2$) layer. The additional layer 205C can increase adhesion between layers 202C, 204C of the multi-layer piezoelectric substrate 206C. Alternatively or additionally, the additional layer 205C can increase heat dissipation in the SAW device 200C relative to the SAW device 200, 200'. Although the multilayer piezoelectric substrate 206C is illustrated as including three layers, more or fewer layers may be included. A multi-layer piezoelectric substrate can be implemented in accordance with any suitable principles and advantages disclosed herein.

The SAW resonator 200C also differs from the SAW resonator 200A in that end portions of the fingers 214C have a bus bar connection portion 241C that extends from bus bar 212C, a widened portion 242C, a body portion 243C, and an end or edge portion 224C. Both the end or edge portion 224C and the widened portion 242C are wider than the other portions of the finger 214C. The widened portion 242C and the end or edge portion 224C of the finger 214C are included in border regions on opposing sides of the active region of the SAW resonator 200C that include the IDT 210C. The end or edge portions 224C and widened portions 242C of the fingers 214C of the IDT 210C can have a square (e.g., hammerhead) shape and can make the SAW resonator 200C a piston mode Lamb wave resonator.

Figure 6C:
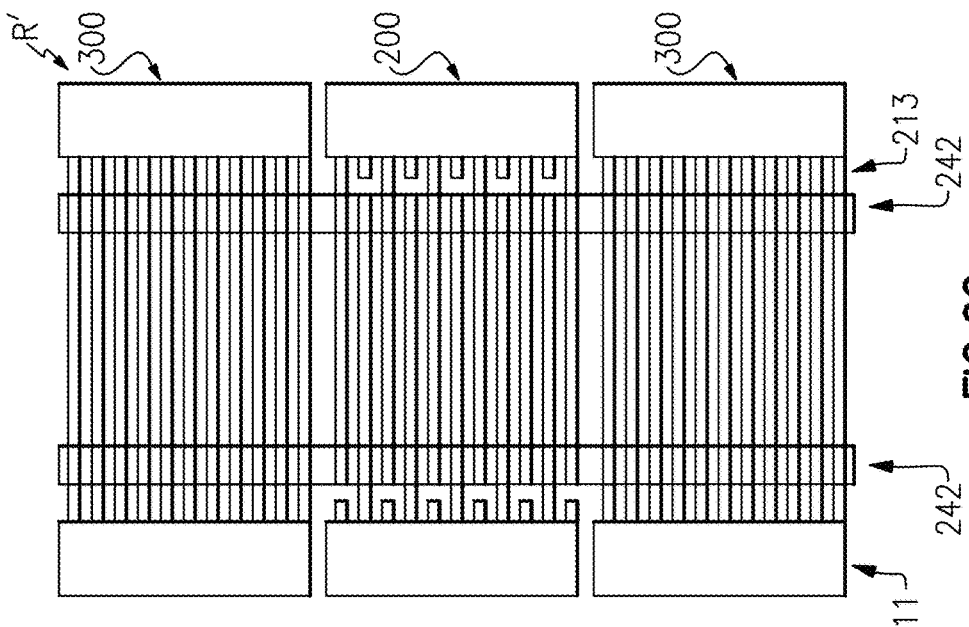
FIG. 6C is an illustration of another step in a process of making a resonator including the SAW device of FIG. 5A.
Figure 6B:
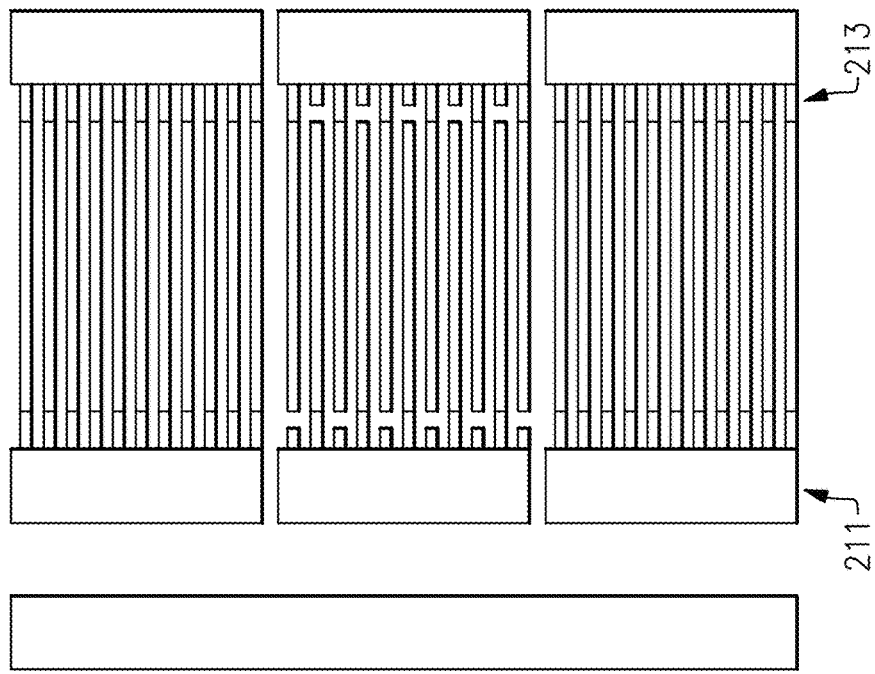
FIG. 6B is an illustration of another step in a process of making a resonator including the SAW device of FIG. 5A.
Figure 6A:
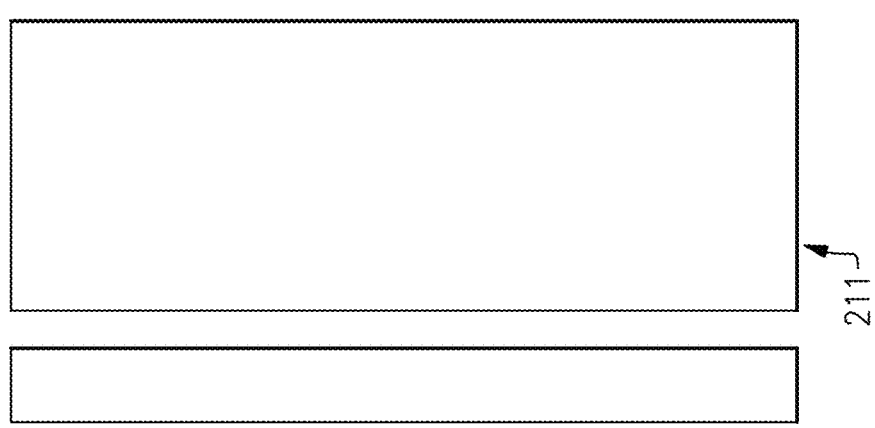
FIG. 6A is an illustration of one step in a process of making a resonator including the SAW device of FIG. 5A.

FIGS. 6A-6C show steps in a process for making the IDT of a resonator R' using the SAW device 200 of FIGS. 5A-5B. As shown in FIG. 6A, the first IDT sublayer 211 is applied (e.g., deposited), for example, over the piezoelectric layer 202 and patterned. In one example, the first IDT sublayer 211 can be made of Aluminum (Al). As shown in FIG. 6B, the second IDT sublayer 213 is applied (e.g., deposited), for example, on the first IDT sublayer 211 and the first and second IDT sublayers 211, 213 are patterned to define the IDT structure of the SAW device 200 and the acoustic reflectors 300. In one example, the second IDT sublayer 113 can be made of tungsten (W). As shown in FIG. 6C, the piston mode layer or strips (e.g., mass loading strips) 242 can then be applied over the edge regions of the IDT 210 and patterned.

Figure 7:
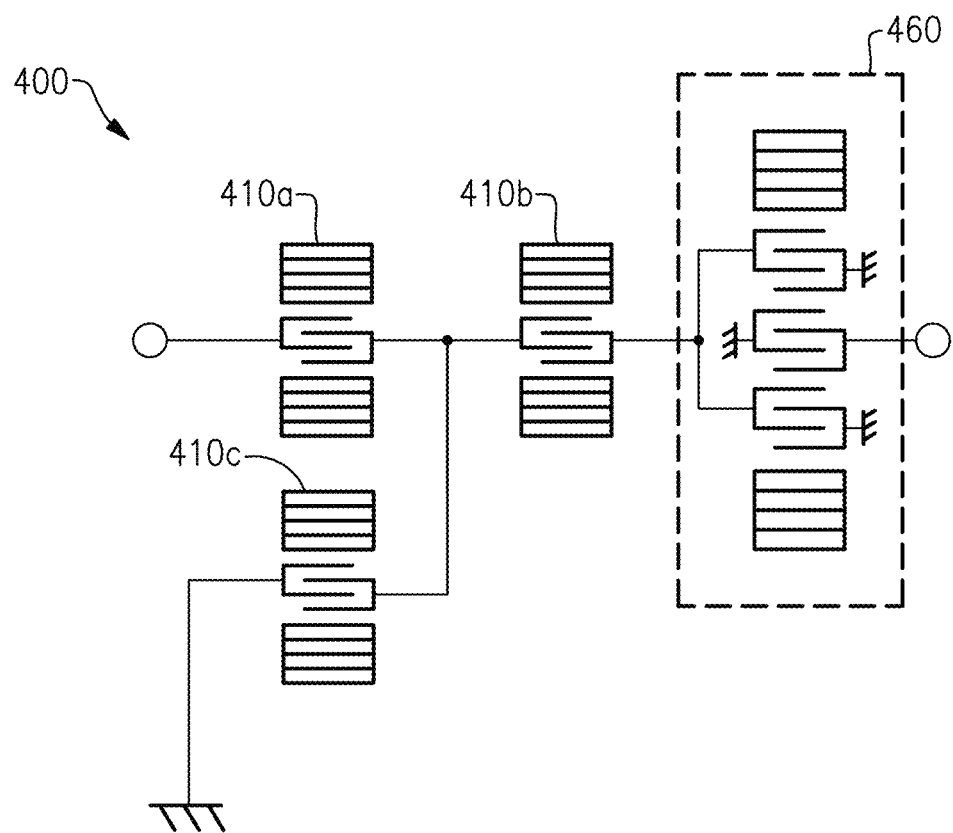
FIG. 7 is a top plan view of a surface acoustic wave filter.

FIG. 7 is a top plan view of a surface acoustic wave filter including a multi-mode surface acoustic wave filter. The filter 400 includes three SAW resonators 410a, 410b, and 410c, as well as a multi-mode surface acoustic wave filter 460, referred to herein as an MMS 460. Although schematically illustrated as being shorter in length than the MMS 460, the SAW resonators 410a, 410b, and 410c may in some embodiments be substantially longer in length than the MMS 460, such that a reduction in length of the SAW resonators 410a, 410b, and 410c can have a significant impact on the overall wafer area occupied by the components of filter 400. A SAW device can in one implementation be a SAW resonator.

The MMS filter 460 is a type of an acoustic wave filter. The MMS filter 460 includes a plurality of IDT electrodes that are longitudinally coupled to each other and positioned between acoustic reflectors. Some MMS filters are referred to as double mode surface acoustic wave (DMS) filters. There may be more than two modes of such DMS filters and/or for other MMS filters. MMS filters can have a relatively wide passband due to a combination of various resonant modes. MMS filters can have a balanced (differential) input and/or a balanced output with proper arrangement of IDTs. MMS filters can achieve a relatively low loss and a relatively good out of band rejection. In certain applications, MMS filters can be receive filters arranged to filter radio frequency signals. The MMS filter 460 can be included in a receive filter that also includes a plurality of acoustic resonators arranged in a ladder topology, for example, as shown in FIG. 7. The MMS filter 460 can be temperature compensated by including a temperature compensation layer, such as a silicon dioxide layer, over IDT electrodes. Such a temperature compensation layer can cause a temperature coefficient of frequency (TCF) of the MMS filter 460 to be closer to zero. In some instances, the MMS filter 460 can include a multi-layer piezoelectric substrate.

Each of the components of the filter 400 can include a high-density interdigital transducer electrode. Due to the reduced footprint of the filter components, particularly the SAW resonators 410a, 410b, and 410c, the overall size of the wafer occupied by the filter components may be reduced. However, the use of a denser IDT electrode in the MMS 460 can alter the frequency response of the MMS 460.

In one implementation, the SAW resonators 410a, 410b and 410c can be similar to the SAW resonator 200 where the IDT 210 includes a first IDT sublayer 211 and a second IDT sublayer 213, the second IDT sublayer 213 including a material of higher density (e.g., tungsten) than the material of the first IDT sublayer 211 (e.g., Aluminum). Similarly, the IDT electrodes of SAW devices in the MMS 460 can be similar to the SAW device 200. The SAW resonators 410a, 410b and 410c can have a second IDT sublayer 213 (e.g., including tungsten) with a greater thickness than the second IDT sublayer 213 of the IDT in the SAW devices of the MMS 460. For example, where the second IDT sublayer 213 of the SAW resonators 410a, 410b, 410c includes tungsten (W), the second IDT sublayer 213 can have a thickness between about $0.04\lambda$, and $0.10\lambda$. Alternatively, where the second IDT sublayer 213 of the SAW resonators 410a, 410b, 410c includes molybdenum (Mo), the second IDT sublayer 213 can have a thickness of between about $0.06\lambda$ and $0.12\lambda$. In one implementation, where the second IDT sublayer 213 of the IDT in the SAW devices of the MMS 460 includes tungsten (W), the second IDT sublayer 213 can have a thickness of between about $0.01\lambda$ and $0.04\lambda$. Alternatively, where the second IDT sublayer 213 of the IDT in the SAW devices of the MMS 460 includes molybdenum (Mo), the second IDT sublayer can have a thickness of between $0.02\lambda$ and $0.06\lambda$.

The different thicknesses of the second IDT sublayer 213 (e.g., layer including tungsten) can be achieved by etching some of the material of the second IDT sublayer 213 in the IDTs of the MMS 460 to achieve a smaller thickness of the second IDT sublayer 213 (e.g., of tungsten) for the IDTs of the MMS 460 relative to the IDTs of the SAW resonators 410a, 410b, 410c. The different thicknesses of the second IDT sublayer 213 of the IDTs in the SAW resonators 410a, 410b, 410c relative to those in the MMS 460 allow for partial slowdown of the IDT, and thereby change the acoustic performance of the IDTs on the same chip to optimize for both the filter 400 performance and MMS 460 performance. The implementation shown on FIG. 7 advantageously allows for the MMS 460 with the relatively thinner second IDT sublayer 213 to optimize its performance, along with the SAW resonators 410a, 410b, 410c of the filter 400 with relatively thicker second IDT sublayer 213 for size reduction and to partially slow down the IDT, to be included on the same chip.

Figure 8A:
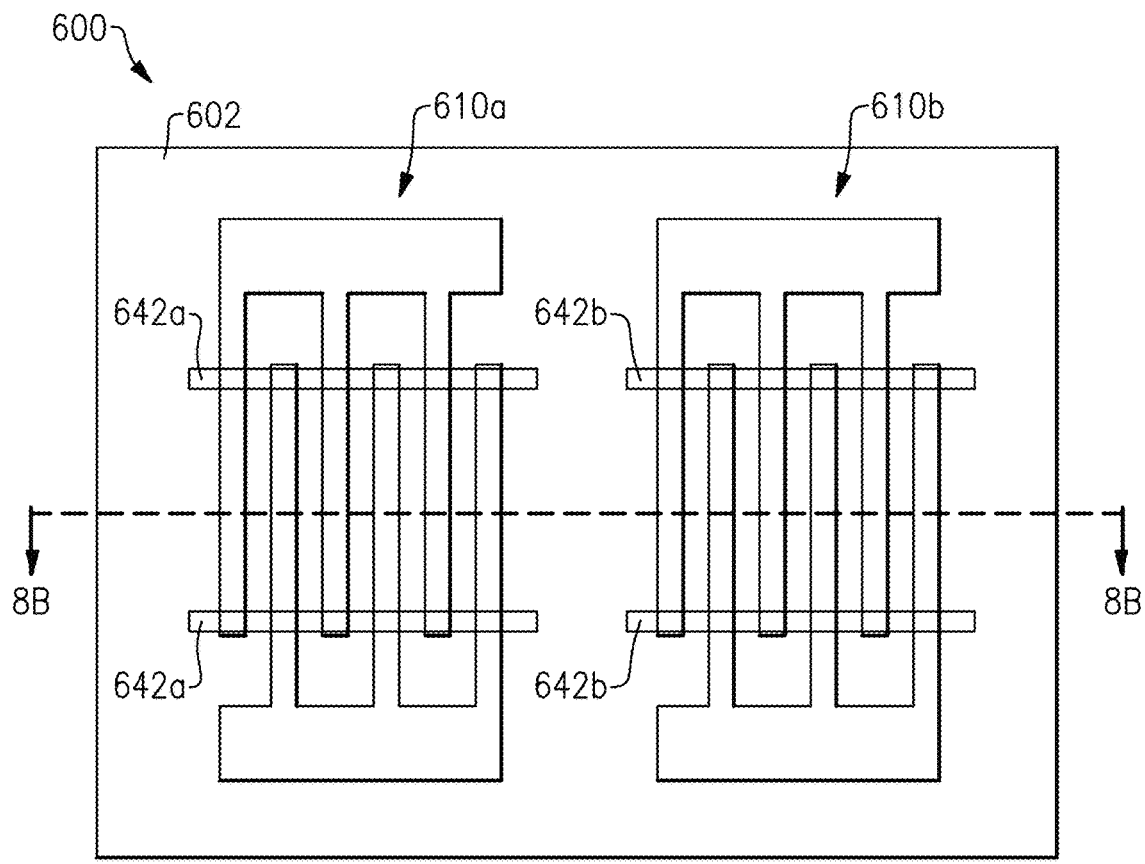
FIG. 8A is a top plan view of multiple surface acoustic wave devices disposed on a single substrate.
Figure 8B:
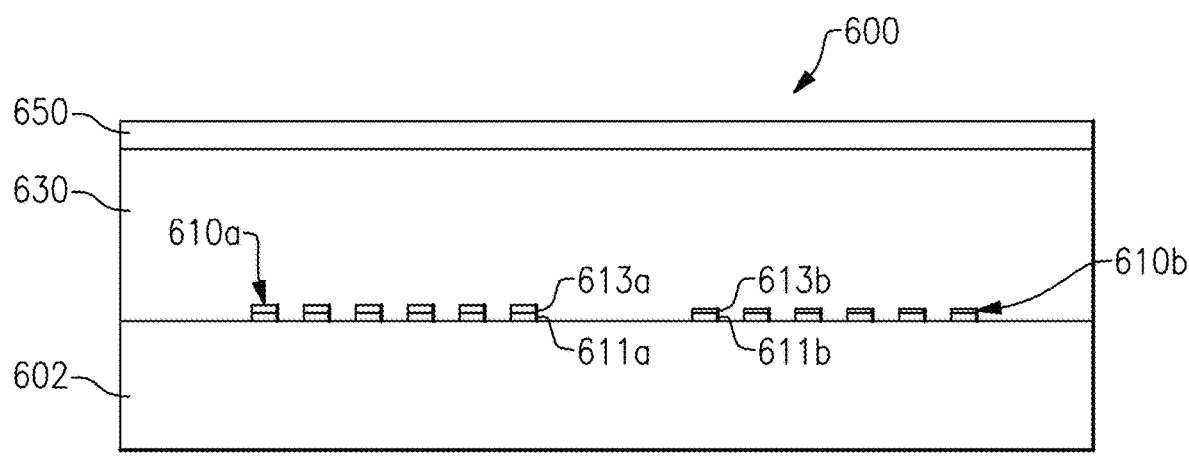
FIG. 8B illustrates a cross-section of the surface acoustic wave devices of FIG. 8A.

FIG. 8A is a top plan view of a structure 600 with two surface acoustic wave resonators 610a, 610b disposed on a single wafer 602. FIG. 8B illustrates a cross-section of the structure 600 of FIG. 8A along the dashed line shown in FIG. 8A.

The structure 600 includes the single wafer 602 supporting the first SAW resonator 610a and the second SAW resonator 610b. The first SAW resonator 610a has a multilayer IDT electrode with a first IDT sublayer 611a and a second IDT sublayer 613a, while the second SAW resonator 610b includes has a multilayer IDT electrode with a first IDT sublayer 611b and a second IDT sublayer 613b. The thickness of the second IDT sublayer 613a of the IDT of the first SAW resonator 610a is greater (e.g., thicker) than the thickness of the second IDT sublayer 613b of the IDT of the second SAW resonator 610b. The second IDT sublayers 613a, 613b can include a material with a higher density (e.g., tungsten) than the material (e.g., Aluminum) of the first IDT sublayers 611a, 611b. Optionally, the first IDT sublayer 611a can have the same thickness along the length of the fingers of the IDT. Optionally, the first IDT sublayer 611b can have the same thickness as the first IDT sublayer 611a. In one implementation, the second IDT sublayer 613a can have the same thickness along the length of the fingers of the IDT. In one implementation, the second IDT sublayer 613b can have the same thickness along the length of the fingers of the IDT.

The first SAW resonator 610a and second SAW resonator 610b are covered by a temperature compensation layer 630

(e.g., including a silicon dioxide, SiO2, material) and a passivation layer 650. The wafer 602 material can in one implementation include lithium niobate (LN); other suitable materials can be used. Strips (e.g., mass loading strips, metal strips, such as high density metal strips of any suitable metal with a density equal to or greater than a layer of the IDT electrode) 642a, 642b are disposed over the end portions of the fingers of the IDT for the first SAW resonator 610a and second SAW resonator 610b, respectively. The different thicknesses of the second IDT sublayer 613a, 613b of the first and second SAW resonators 610a, 610b (e.g., the IDT sublayers with more dense material, such as tungsten) advantageously allow a variation in the mass loading of the resonators 610a, 610b on the same wafer 602 (e.g., same chip), and allow adjustment of acoustic properties of the SAW resonators 610a, 610b without significantly impacting their electrical properties.

Figure 9A:
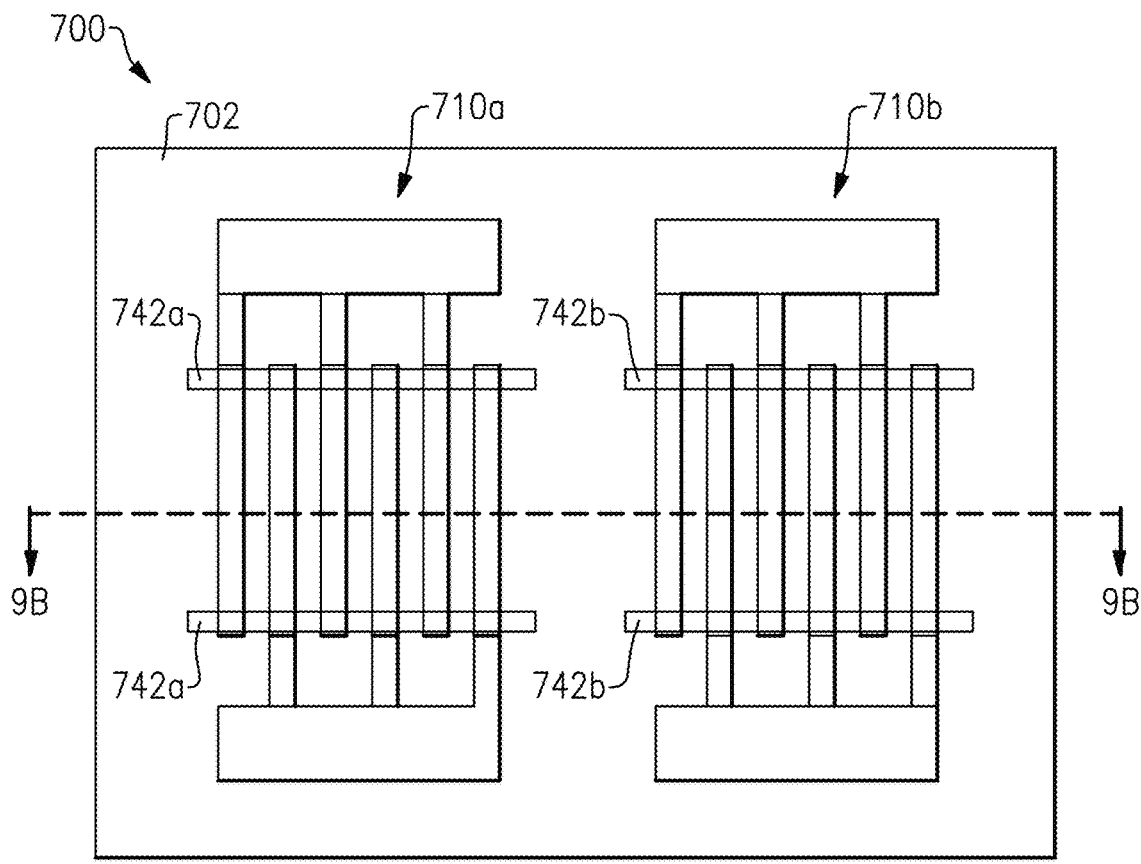
FIG. 9A is a top plan view of multiple surface acoustic wave devices disposed on a single substrate.
Figure 9B:
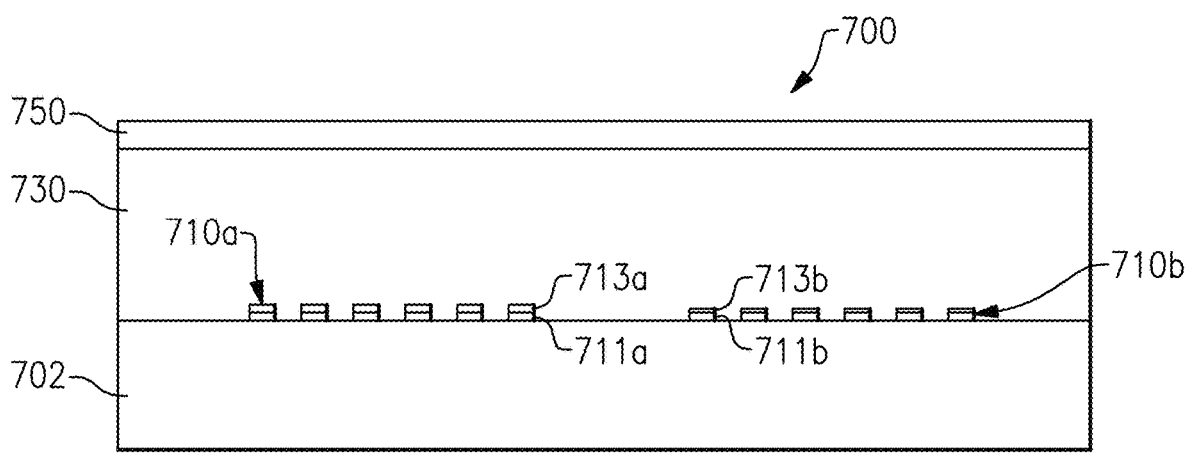
FIG. 9B illustrates a cross-section of the surface acoustic wave devices of FIG. 9A.

FIG. 9A is a top plan view of a structure 700 with two surface acoustic wave resonators 710a, 710b disposed on a single wafer 702. FIG. 9B illustrates a cross-section of the structure 700 of FIG. 9A along the dashed line shown in FIG. 9A. The structure 700 of FIGS. 9A-9B is similar to the structure 600 in FIGS. 8A-8B. Thus, reference numerals used to designate the various components of the structure 700 are identical to those used for identifying the corresponding components of the structure 600 in FIGS. 8A-8B, unless otherwise noted, except that the numerical identifier begins with a "7". Therefore, the structure and description above for the various features of the structure 600 in FIGS. 8A-8B are understood to also apply to the corresponding features of the structure 700 in FIGS. 9A-9B, except as described below.

The structure 700 differs from the structure 600 in that at least a portion of (e.g., ½, ¾, all of) the second IDT sublayer 713a of the IDT in the first SAW resonator 710a is removed from the gap region of the IDT. Otherwise, as with the structure 600, the thickness of the second IDT sublayer 713a of the IDT in the first SAW resonator 710a is greater (e.g., thicker) than the second IDT sublayer 713b of the IDT in the second SAW resonator 710b. Therefore, in one implementation the IDT for the SAW resonator 710a in the gap region only includes the first IDT sublayer 711a. In another implementation, the thickness of the second IDT sublayer 713a of the IDT in the first SAW resonator 710a is thinner in the gap region than in other portions of the second IDT sublayer 713a, so that the gap region includes the first IDT sublayer 711a and the thinner portion of the second IDT sublayer 713a. Advantageously, removing at least a portion of (e.g., ½, ¾, all of) the second IDT sublayer 713a from the gap region for the IDT in the first SAW resonator 710a results in improved Q performance for the SAW resonator 710a.

Figure 10A:
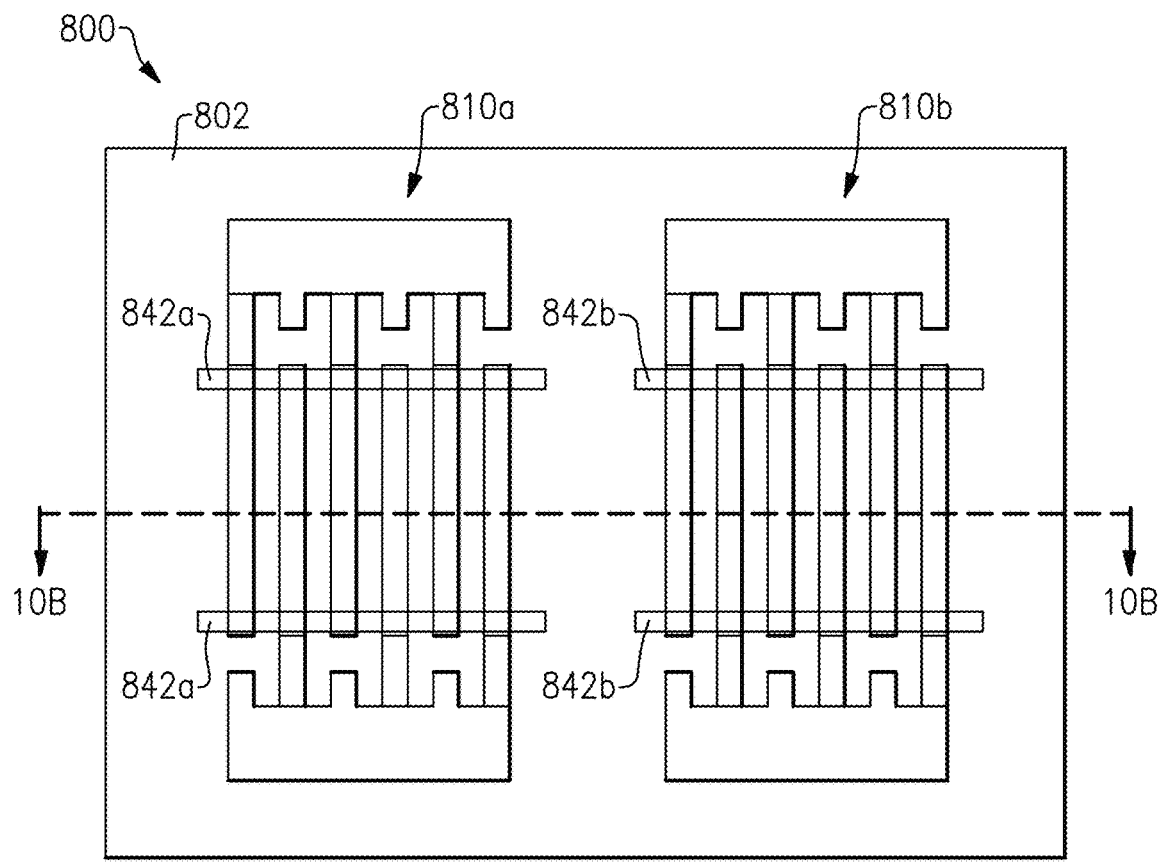
FIG. 10A is a top plan view of multiple surface acoustic wave devices disposed on a single substrate.
Figure 10B:
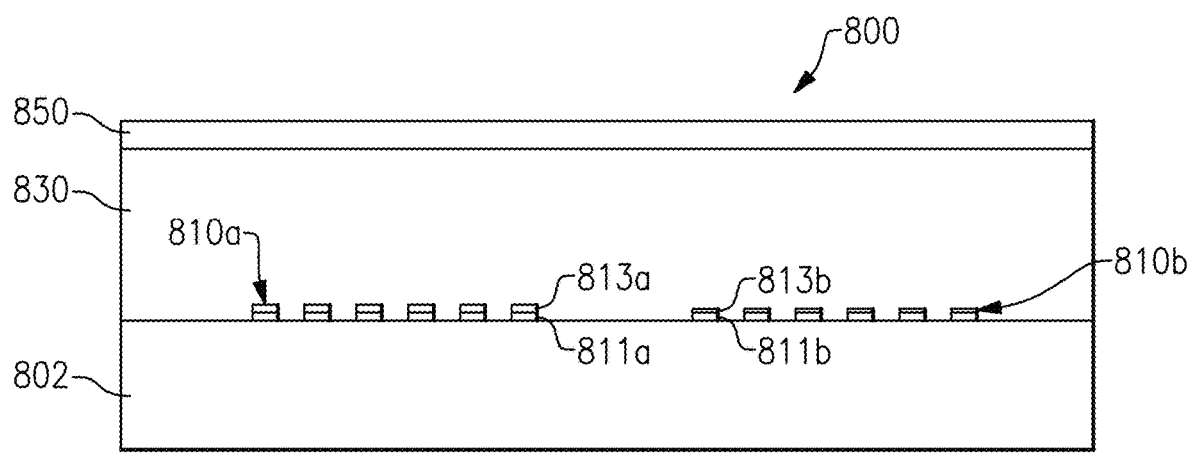
FIG. 10B illustrates a cross-section of the surface acoustic wave devices of FIG. 10A.

FIG. 10A is a top plan view of a structure 800 with two surface acoustic wave resonators 810a, 810b disposed on a single wafer 802. FIG. 10B illustrates a cross-section of the structure 800 of FIG. 10A along the dashed line shown in FIG. 10A. The structure 800 of FIGS. 10A-10B is similar to the structure 700 in FIGS. 9A-9B. Thus, reference numerals used to designate the various components of the structure 800 are identical to those used for identifying the corresponding components of the structure 700 in FIGS. 9A-9B, unless otherwise noted, except that the numerical identifier begins with a "8". Therefore, the structure and description above for the various features of the structure 700 in FIGS. 9A-9B are understood to also apply to the corresponding features of the structure 800 in FIGS. 10A-10B, except as described below.

The structure 800 differs from the structure 700 in that the IDT of the first SAW resonator 810a and second SAW resonator 810b include dummy electrodes that extend from the bus bar and are spaced apart from end or edge portions of the fingers of the IDT. Otherwise, as with the structure 700, the thickness of the second IDT sublayer 813a of the IDT in the first SAW resonator 810a is greater (e.g., thicker) than the second IDT sublayer 813b of the IDT in the second SAW resonator 810b. As with the structure 700, removing at least a portion of (e.g., ½, ¾, all of) the second IDT sublayer 813a from the gap region for the IDT in the first SAW resonator 810a advantageously results in improved Q performance for the SAW resonator 810a.

Piston mode Lamb wave resonators can be implemented in a variety of ways. As an example, a metal layout of an interdigital transducer of a Lamb wave resonator can contribute to a velocity in a border region having a lower magnitude than a velocity in an active region. For instance, an end portion of an interdigital transducer electrode finger can have wider metal than the rest of the finger. Alternatively or additionally, a bus bar can have a lower metal coverage ratio adjacent to an end portion of an interdigital transducer finger. As another example, a layer over an interdigital transducer electrode can contribute to a velocity in a border region having a lower magnitude than a velocity in an active region. Such a layer can be over the active region to increase the magnitude of the velocity in the active region relative to the border region. Alternatively or additionally, a layer over the border region can reduce the velocity of the border region relative to the active region. Example embodiments of piston mode Lamb wave resonators will be discussed with reference to FIGS. 11A-11E. In the Lamb wave resonators of any of FIGS. 11A-11E, an IDT can be on aluminum nitride piezoelectric layer. Any suitable principles and advantages of the embodiments described herein can be combined with each other. Any suitable principles and advantages of these embodiments can be implemented in a piston mode Lamb wave resonator.

Figure 11A:
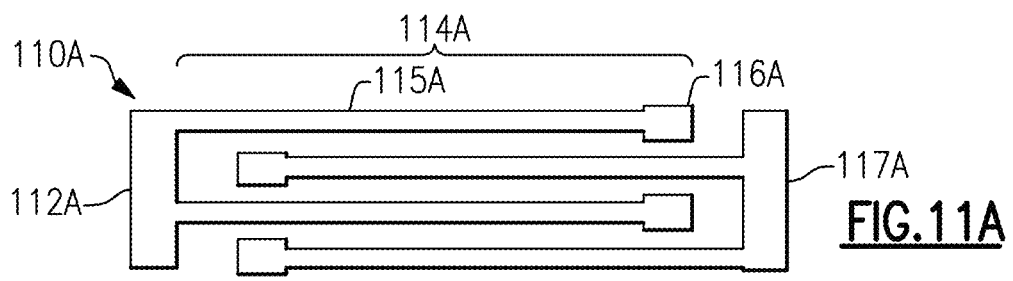
FIGS. 11A to 11E are diagrams of IDTs of piston mode Lamb wave resonators according to various embodiments.

FIG. 11A illustrates an IDT 110A of a piston mode Lamb wave resonator according to an embodiment. The IDT 110A includes fingers having hammer head shaped end portions. The IDT 110A includes bus bars 112A and 117A and a plurality of fingers extending from the bus bars 112A and 117A. As illustrated, each of the fingers of the IDT 110A are substantially the same. Finger 114A will be discussed as an example. Finger 114A has a body portion 115A that extends from bus bar 112A and an end portion 116A. The end portion 116A is adjacent to the bus bar 117A. The end portion 116A is wider that the rest of the finger 114A. The end portion 116A is hammer head shaped in plan view. The end portions (e.g., end portion 116A) of the fingers 114A of the IDT 110A can make the Lamb wave resonator a piston mode Lamb wave resonator.

Figure 11B:
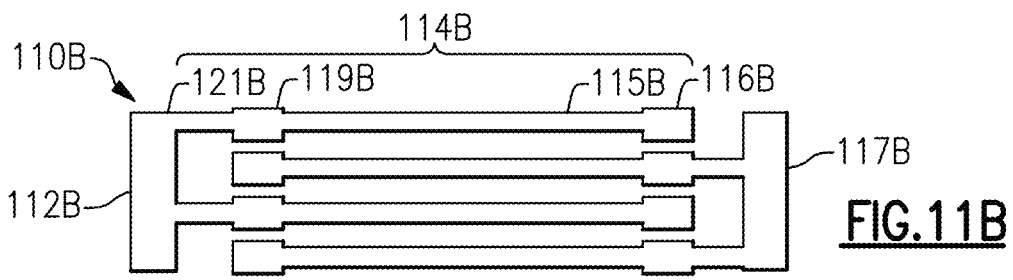

FIG. 11B illustrates an IDT 110B of a piston mode Lamb wave resonator according to another embodiment. The IDT 110B has with thicker portions for both border regions of each finger. The IDT 110B is like the IDT 110A of FIG. 11A except that the fingers of the IDT 110B are wider adjacent to both bus bars 112B and 117B. Finger 114B will be discussed as an example. Finger 114B has a bus bar connection portion 121B that extends from bus bar 112B, a widened portion 119B, a body portion 115B, and an end portion 116B. Both the end portion 116B and the widened portion 119B are wider than the other portions of the finger 114B. The widened portion 119B and the end portion 116B of the finger 114B are included in border regions on opposing sides of the active region of the Lamb wave resonator that include the IDT 110B. The end portions (e.g., end portion 116B) and widened portions (e.g., widened portion 119B) of the fingers 114B of the IDT 110B can make the Lamb wave resonator a piston mode Lamb wave resonator.

Figure 11C:
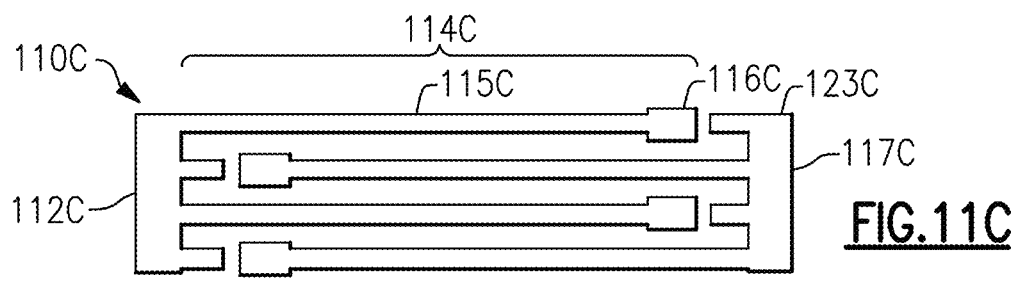

FIG. 11C illustrates an IDT 110C of a piston mode Lamb wave resonator according to another embodiment. The IDT 110C includes fingers having hammer head shaped end portions and bus bars having extension portions adjacent to the end portions of the fingers. The IDT 110C is like the IDT 110A of FIG. 11A except that the bus bars of the IDT 110C have extension portions adjacent to end portions of fingers. Finger 114C has a body portion 115D that extends from the bus bar 112C, 117C to an end portion 116C. Bus bars 112C and 117C each include extension portions, such as extension portion 123C, adjacent to end portions 116C of fingers 114C of the IDT 110C. The extension portions of the bus bars 112C and 117C can increase the metal coverage ratio around the border regions relative to the active region of the Lamb wave resonator. The end portions (e.g., end portion 116C) of the finger 114C and extension portions (e.g., extension portion 123C) of the bus bars of the IDT 110C can make the Lamb wave resonator a piston mode Lamb wave resonator.

Figure 11D:
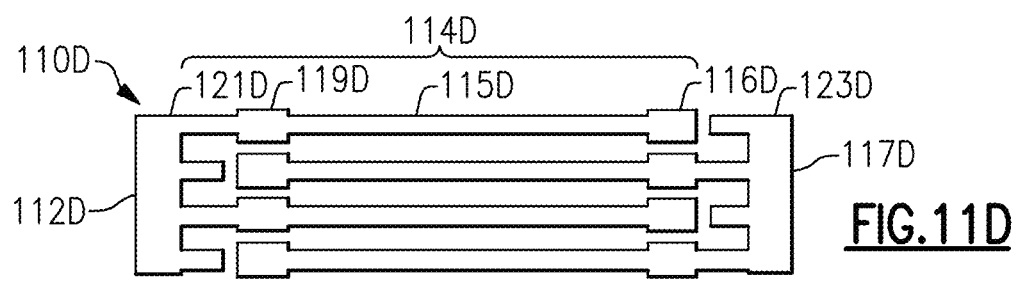

FIG. 11D illustrates an IDT 110D of a piston mode Lamb wave resonator according to another embodiment. The IDT 110D has thicker end portions on border regions of each finger and bus bars having extension portions adjacent to end portions of the fingers. The IDT 110D includes features of the IDT 110C of FIG. 11C and the IDT 110B of FIG. 11B. Finger 114D has a bus bar connection portion 121D that extends from bus bar 112D, a widened portion 119D, a body portion 115D, and an end portion 116D. Bus bars 112D and 117D each include extension portions, such as extension portion 123D, adjacent to end portions 116D of fingers 114D of the IDT 110D.

Figure 11E:
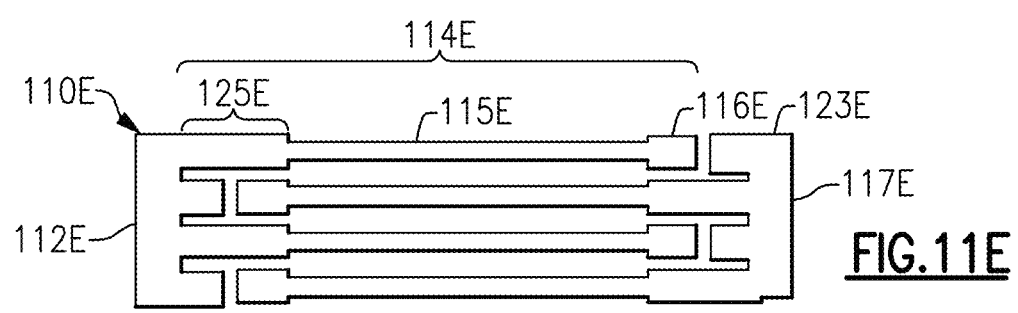

FIG. 11E illustrates an IDT 110E of a piston mode Lamb wave resonator according to another embodiment. The IDT 110E includes fingers having thicker end portions and thicker regions extending from a bas bar toward an active region of the Lamb wave resonator. The IDT 110E is similar to the IDT 110C of FIG. 11C except the fingers of IDT 110E include a widened portion extending from bus bars. As shown in FIG. 11E, finger 114E of the IDT 110E includes widened portion 125E extending from the bus bar 112E to body portion 115E. The finger 114E also includes end portion 116E. Bus bars 112E and 117E each include widened extension portions, such as widened extension portion 123E, adjacent to end portions 116E of fingers 114E of the IDT 110E.

Figure 11F:
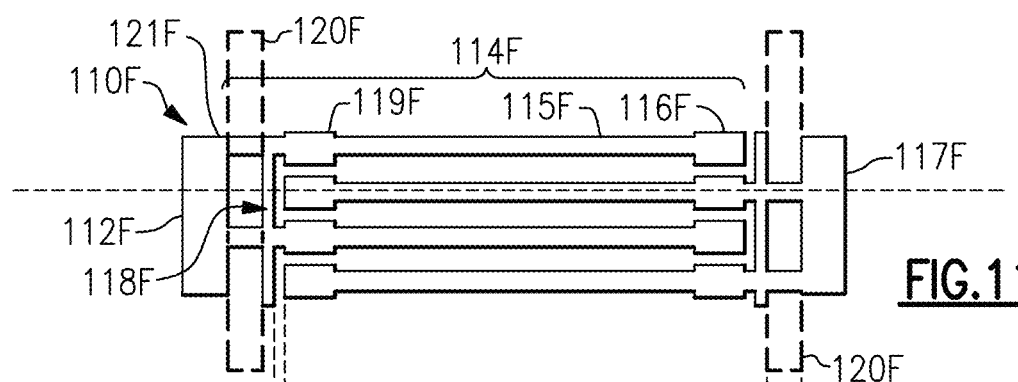
FIG. 11F illustrates an IDT with a second narrow busbar and FIG. 11G illustrates a cross-section of a surface acoustic wave (SAW) device including the IDT of FIG. 11F.

FIG. 11F illustrates an IDT 110F of a piston mode Lamb wave resonator according to another embodiment. The IDT 110F is similar to the IDT 110B in FIG. 11B. Thus, the reference numerals used to designate the various components or features of the IDT 110F are identical to those used for identifying the corresponding components or features of the IDT 110B in FIG. 11B, except that "F" instead of "B" has been added to the numerical identifier. Therefore, the structure and description of the various components or features of the IDT 110B in FIG. 11B are understood to also apply to the corresponding components or features of the IDT 110F in FIG. 11F, except as described below.

The IDT 110F differs from the IDT 110B in that it includes a second busbar 118F spaced from the busbar 112F, 117F and the widened (e.g., hammerhead) portion 119F, 116F. The second busbar 118F can have a smaller width (e.g., be narrower) than the busbar 112F, 117F. The second busbar 118F provides a mechanical mass loading effect to suppress higher order transverse modes. The busbar 112F, 117F primarily supplies electrical current for the IDT 110F. The IDT 110F has a low density IDT region 120F as shown in FIG. 11F and further described below with reference to FIG. 11G.

Figure 11G:
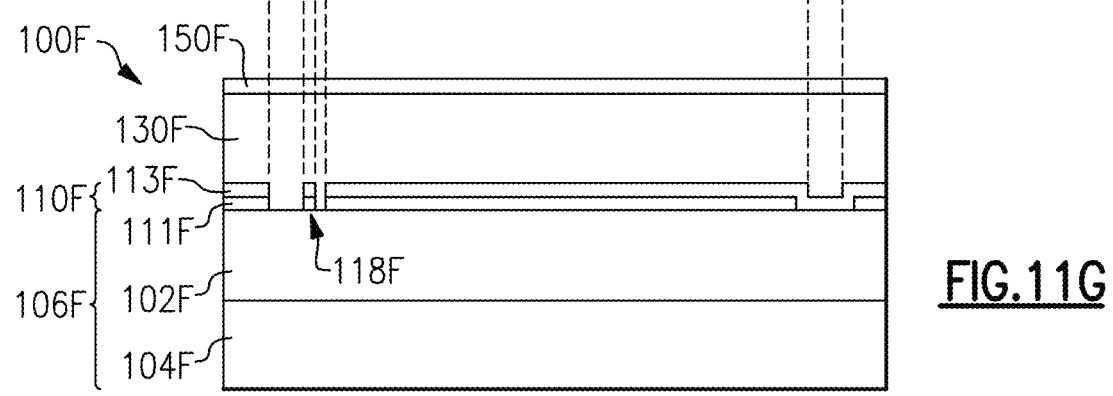

FIG. 11G is a cross-sectional view of a SAW device 100F including the IDT 110F. The SAW device 100F is similar to the SAW device 100' in FIG. 1C. Thus, the reference numerals used to designate the various components or features of the SAW device 110F are identical to those used for identifying the corresponding components or features of the SAW device 100' in FIG. 1C, except that "F" has been added to the numerical identifier. Therefore, the structure and description of the various components or features of the SAW device 100' in FIG. 1C are understood to also apply to the corresponding components or features of the SAW device 100F in FIG. 11G, except as described below.

The SAW device 100F differs from the SAW device 100' in that the mass loading strips 142 in the SAW device 100' are excluded from the SAW device 100F. In another implementation, mass loading strips (similar to the mass loading strips 142 in the SAW device 100') can be added to the SAW device 100F. Additionally, the SAW device 100F includes the second busbar 118F. In the illustrated embodiment, the second busbar 118F is a defined by first IDT sublayer 111F and second IDT sublayer 113F disposed over the first IDT sublayer 111F. As with the SAW device 100', the first IDT sublayer 111F can be of a material with a higher density than the material of the second IDT sublayer 113F. In some embodiments, the first IDT sublayer 111F may include tungsten (W) and the second IDT sublayer 113F may include Aluminum (Al). The portion of the IDT where the first IDT sublayer 111F is thinned or removed and filled by the material of the second IDT sublayer 113F provides a low density IDT region 120F between the busbar 112F, 117F and the second busbar 118F.

In another implementation, the SAW device 110F can instead have the first IDT sublayer 111F be of a material with a lower density (e.g., Aluminum) than the material of the second IDT sublayer 113F (e.g., tungsten) and the IDT 110F can have at least a portion (e.g., all) of the second IDT sublayer 113F removed between the busbar 112F, 117F and the second busbar 118F (e.g., similar to the profile of the IDT 210 shown in FIG. 5A), to provide the low density IDT region 120F between the busbar 112F, 117F and the second busbar 118F.

FIG. 11H illustrates an IDT 110G of a piston mode Lamb wave resonator according to another embodiment. The IDT 110G is similar to the IDT 110F in FIG. 11F. Thus, the reference numerals used to designate the various components or features of the IDT 110G are identical to those used for identifying the corresponding components or features of the IDT 110F in FIG. 11F, except that "G" instead of "F" has been added to the numerical identifier. Therefore, the structure and description of the various components or features of the IDT 110F in FIG. 11F are understood to also apply to the corresponding components or features of the IDT 110G in FIG. 11H, except as described below.

The IDT 110G differs from the IDT 110F in that the second busbar 118G is disconnected between fingers 114G of the IDT 110G. The disconnected second busbar 118G provide mechanical mass loading to suppress higher order transverse mode. The busbar 112G, 117G primarily supplies electrical current for the IDT 110G. The IDT 110G has a low density IDT region 120G as shown in FIG. 11H.

FIG. 11I is a cross-sectional view of a SAW device 100G including the IDT 110G. The SAW device 100G is similar to the SAW device 100F in FIG. 11G. Thus, the reference numerals used to designate the various components or features of the SAW device 110G are identical to those used for identifying the corresponding components or features of the SAW device 100F in FIG. 11F, except that "G" instead of an "F" has been added to the numerical identifier. Therefore, the structure and description of the various components or features of the SAW device 100F in FIG. 11F are understood to also apply to the corresponding components or features of the SAW device 100G in FIG. 11I, except as described below.

The cross-section of the SAW device 100G in FIG. 11I is identical to the cross-section of the SAW device 100F in FIG. 11G. As with the description above for the SAW device 100F, mass loading strips (e.g., similar to mass loading strips 142 in the SAW device 100') can optionally be included in the SAW device 100G. Additionally, the second busbar 118G is a defined by first IDT sublayer 111G and second IDT sublayer 113G disposed over the first IDT sublayer 111G. The first IDT sublayer 111G can be of a material with a higher density than the material of the second IDT sublayer 113G. In some embodiments, the first IDT sublayer 111G may include tungsten (W) and the second IDT sublayer 113G may include Aluminum (Al). The portion of the IDT where the first IDT sublayer 111G is thinned or removed and filled by the material of the second IDT sublayer 113G provides a low density IDT region 120G between the busbar 112G, 117G and the second busbar 118G. In another implementation, the SAW device 110G can instead have the first IDT sublayer 111G be of a material with a lower density (e.g., Aluminum) than the material of the second IDT sublayer 113G (e.g., tungsten) and the IDT 110G can have at least a portion (e.g., all) of the second IDT sublayer 113G removed between the busbar 112G, 117G and the second busbar 118G to provide the low density IDT region 120G between the busbar 112G, 117G and the second busbar 118G. The mass loading provided by the disconnected second busbar 118G can be tuned by changing the width of the gap between an end of the disconnected busbar 118G and the next finger 114G.

FIG. 11J illustrates an IDT 110H of a piston mode Lamb wave resonator according to another embodiment. The IDT 110H is similar to the IDT 110G in FIG. 11H. Thus, the reference numerals used to designate the various components or features of the IDT 110H are identical to those used for identifying the corresponding components or features of the IDT 110G in FIG. 11H, except that "H" instead of "G" has been added to the numerical identifier. Therefore, the structure and description of the various components or features of the IDT 110G in FIG. 11H are understood to also apply to the corresponding components or features of the IDT 110H in FIG. 11J, except as described below.

The IDT 110H differs from the IDT 110G in that the disconnected second busbar 118G in the IDT 110G is replaced by a floating mass loading strip 118H that is spaced from the busbar 112H, 117H and the ends of the fingers 114H. The floating mass loading strip 118H provides mechanical mass loading to suppress higher order transverse mode. The IDT 110H has a low density IDT region 120H between the busbar 112H, 117H and the floating mass loading strip 118H.

FIG. 11K is a cross-sectional view of a SAW device 100H including the IDT 110H. The SAW device 100H is similar to the SAW device 100G in FIG. 11I. Thus, the reference numerals used to designate the various components or features of the SAW device 110H are identical to those used for identifying the corresponding components or features of the SAW device 100G in FIG. 11I, except that "H" instead of "G" has been added to the numerical identifier. Therefore, the structure and description of the various components or features of the SAW device 100G in FIG. 11I are understood to also apply to the corresponding components or features of the SAW device 100H in FIG. 11K, except as described below.

The cross-section of the SAW device 100H in FIG. 11K is identical to the cross-section of the SAW device 100G in FIG. 11I. As with the description above for the SAW device 100G, mass loading strips (e.g., similar to mass loading strips 142 in the SAW device 100') can optionally be included in the SAW device 100H. Additionally, the floating mass loading strip 118H is a defined by first IDT sublayer 111H and second IDT sublayer 113H disposed over the first IDT sublayer 111H. The first IDT sublayer 111H can be of a material with a higher density than the material of the second IDT sublayer 113H. In some embodiments, the first IDT sublayer 111H may include tungsten (W) and the second IDT sublayer 113H may include Aluminum (Al). The portion of the IDT 110H where the first IDT sublayer 111H is thinned or removed and filled by the material of the second IDT sublayer 113H provides a low density IDT region 120H between the busbar 112H, 117H and the floating mass loading strip 118H. In another implementation, the SAW device 110H can instead have the first IDT sublayer 111H be of a material with a lower density (e.g., Aluminum) than the material of the second IDT sublayer 113H (e.g., tungsten) and the IDT 110H can have at least a portion (e.g., all) of the second IDT sublayer 113H removed between the busbar 112H, 117H and the floating mass loading strip 118H to provide the low density IDT region 120H between the busbar 112H, 117H and the floating mass loading strip 118H. The mass loading provided by the floating mass loading strip 118H can be tuned by changing the width of the gap between an end of the floating mass loading strip 118H and the next finger 114H.

Figure 12:
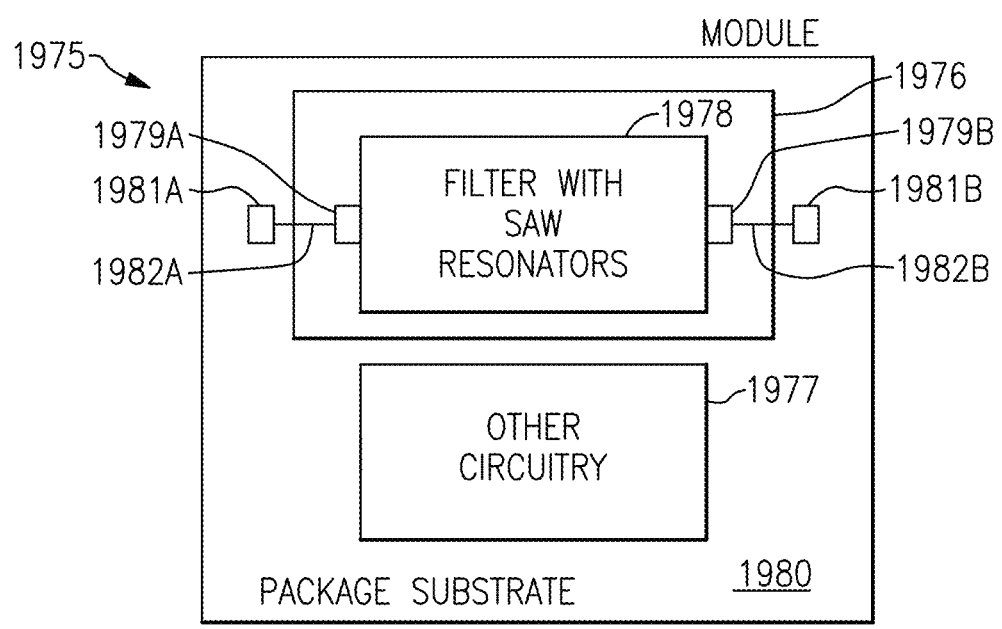
FIG. 12 is a schematic diagram of a radio frequency module that includes a surface acoustic wave component according to an embodiment.

FIG. 12 is a schematic diagram of a radio frequency module 1975 that includes a surface acoustic wave component 1976 according to an embodiment. The illustrated radio frequency module 1975 includes the SAW component 1976 and other circuitry 1977. The SAW component 1976 can include one or more SAW resonators with any suitable combination of features of the SAW resonators disclosed herein. The SAW component 1976 can include a SAW die that includes SAW resonators. The SAW die can also include one or more MMS filters. Some or all of the SAW resonators on the SAW die can include a velocity reduction cover or another velocity adjustment structure.

The SAW component 1976 shown in FIG. 12 includes a filter 1978 and terminals 1979A and 1979B. The filter 1978 includes SAW resonators. One or more of the SAW resonators can be SAW resonators including a velocity reduction cover in accordance with any suitable principles and advantages disclosed herein. The terminals 1979A and 1979B can serve, for example, as an input contact and an output contact. The SAW component 1976 and the other circuitry 1977 are on or supported by a common packaging substrate 1980 in FIG. 12. The package substrate 1980 can be a laminate substrate. The terminals 1979A and 1979B can be electrically connected to contacts 1981A and 1981B, respectively, on or supported by the packaging substrate 1980 by way of electrical connectors 1982A and 1982B, respectively. The electrical connectors 1982A and 1982B can be bumps or wire bonds, for example. The other circuitry 1977 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1975 can include one or more packaging structures to, for example, provide protection and/or facilitate easier handling of the radio frequency module 1975. Such a packaging structure can include an overmold structure formed over the packaging substrate 1975. The overmold structure can encapsulate some or all of the components of the radio frequency module 1975.

Figure 13:
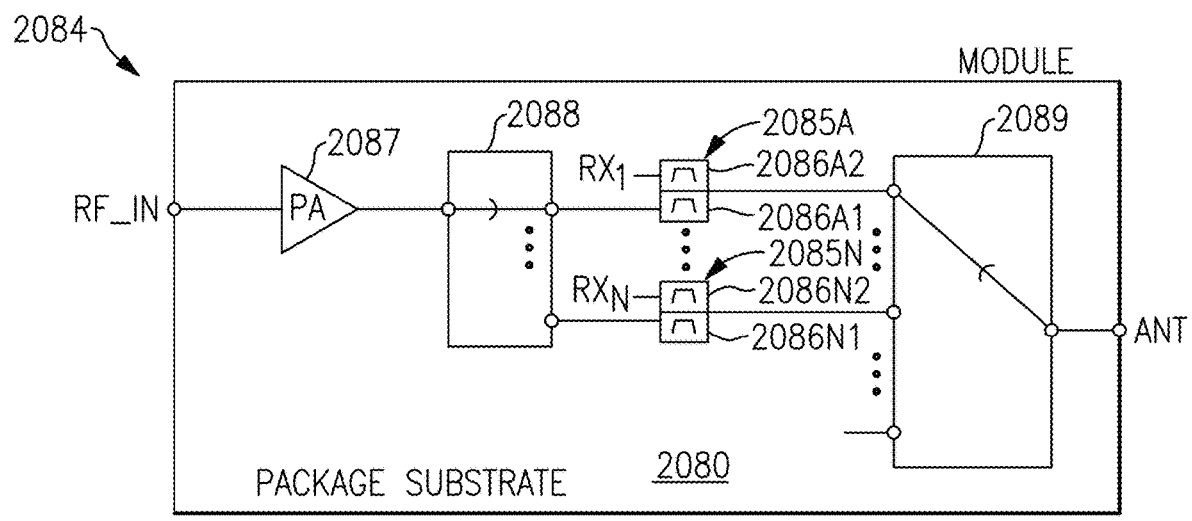
FIG. 13 is a schematic diagram of a radio frequency module that includes duplexers with surface acoustic wave resonators according to an embodiment.

FIG. 13 is a schematic diagram of a radio frequency module 2084 that includes a surface acoustic wave component according to an embodiment. As illustrated, the radio frequency module 2084 includes duplexers 2085A to 2085N that include respective transmit filters 2086A1 to 2086N1 and respective receive filters 2086A2 to 2086N2, a power amplifier 2087, a select switch 2088, and an antenna switch 2089. The radio frequency module 2084 can include a package that encloses the illustrated elements. The illustrated elements can be disposed on a common packaging substrate 2080. The packaging substrate can be a laminate substrate, for example.

The duplexers 2085A to 2085N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 2086A1 to 2086N1 can include one or more SAW resonators in accordance with any suitable principles and advantages disclosed herein. Similarly, one or more of the receive filters 2086A2 to 2086N2 can include one or more SAW resonators in accordance with any suitable principles and advantages disclosed herein. In certain embodiments, one or more of the receive filters 2086A2 to 2086N2 can include one or more SAW resonators with a velocity reduction cover and an MMS filter free from the velocity reduction cover. Although FIG. 13 illustrates duplexers, any suitable principles and advantages disclosed herein can be implemented in other multiplexers (e.g., quadplexers, hexaplexers, octoplexers, etc.) and/or in switch-plexers.

The power amplifier 2087 can amplify a radio frequency signal. The illustrated switch 2088 is a multi-throw radio frequency switch. The switch 2088 can electrically couple an output of the power amplifier 2087 to a selected transmit filter of the transmit filters 2086A1 to 2086N1. In some instances, the switch 2088 can electrically connect the output of the power amplifier 2087 to more than one of the transmit filters 2086A1 to 2086N1. The antenna switch 2089 can selectively couple a signal from one or more of the duplexers 2085A to 2085N to an antenna port ANT. The duplexers 2085A to 2085N can be associated with different frequency bands and/or different modes of operation (e.g., different power modes, different signaling modes, etc.).

Figure 14:
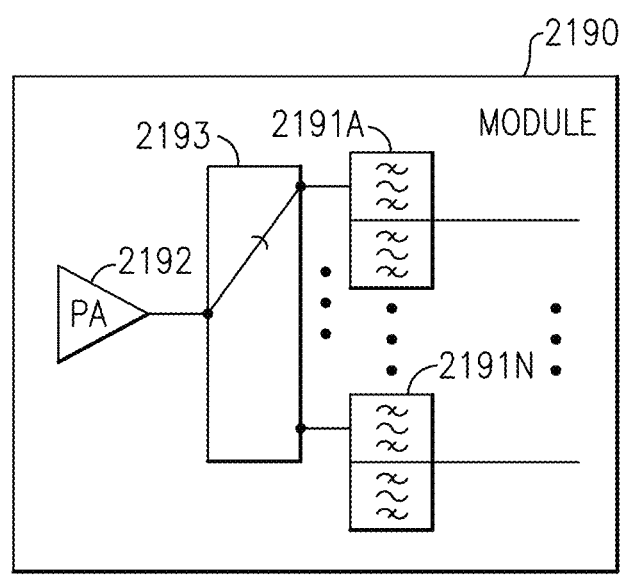
FIG. 14 is a schematic block diagram of a module that includes a power amplifier, a radio frequency switch, and duplexers that include one or more surface acoustic wave resonators according to an embodiment.

FIG. 14 is a schematic block diagram of a module 2190 that includes a power amplifier 2192, a radio frequency switch 2193, and duplexers 2191A to 1291N in accordance with one or more embodiments. The power amplifier 2192 can amplify a radio frequency signal. The radio frequency switch 2193 can be a multi-throw radio frequency switch. The radio frequency switch 2193 can electrically couple an output of the power amplifier 2192 to a selected transmit filter of the duplexers 2191A to 2191N. One or more filters of the duplexers 2191A to 2191N can include any suitable number of surface acoustic wave resonators which include a velocity reduction cover, in accordance with any suitable principles and advantages discussed herein. In certain embodiments, one or more filters of the duplexers 2191A to 2191N can include one or more SAW resonators with a velocity reduction cover and an MMS filter free from the velocity reduction cover. Any suitable number of duplexers 2191A to 2191N can be implemented.

Figure 15:
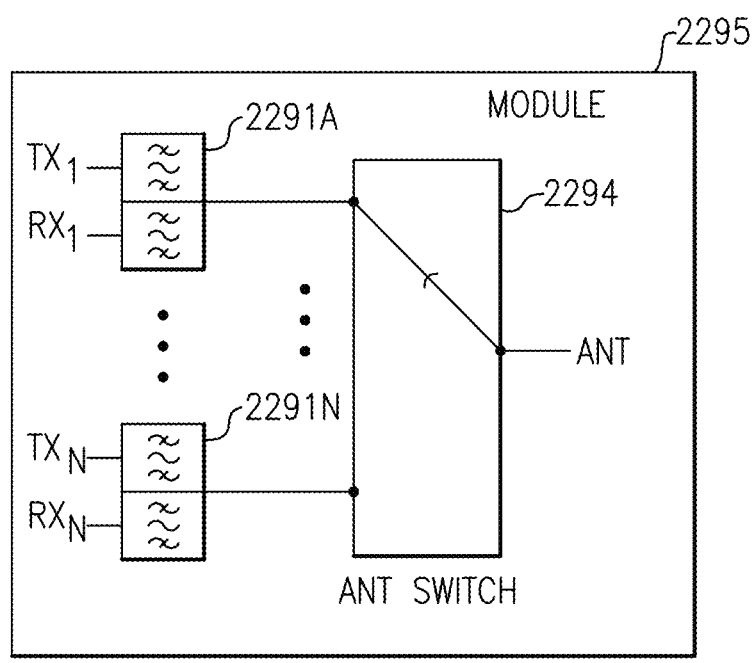
FIG. 15 is a schematic block diagram of a module that includes an antenna switch and duplexers that include one or more surface acoustic wave resonators according to an embodiment.

FIG. 15 is a schematic block diagram of a module 2295 that includes duplexers 2291A to 2291N and an antenna switch 2294. One or more filters of the duplexers 2291A to 2291N can include any suitable number of surface acoustic wave resonators which include a velocity reduction cover, in accordance with any suitable principles and advantages discussed herein. Any suitable number of duplexers 2291A to 2291N can be implemented. The antenna switch 2294 can have a number of throws corresponding to the number of duplexers 2291A to 2291N. The antenna switch 2294 can electrically couple a selected duplexer to an antenna port of the module 2295.

Figure 16:
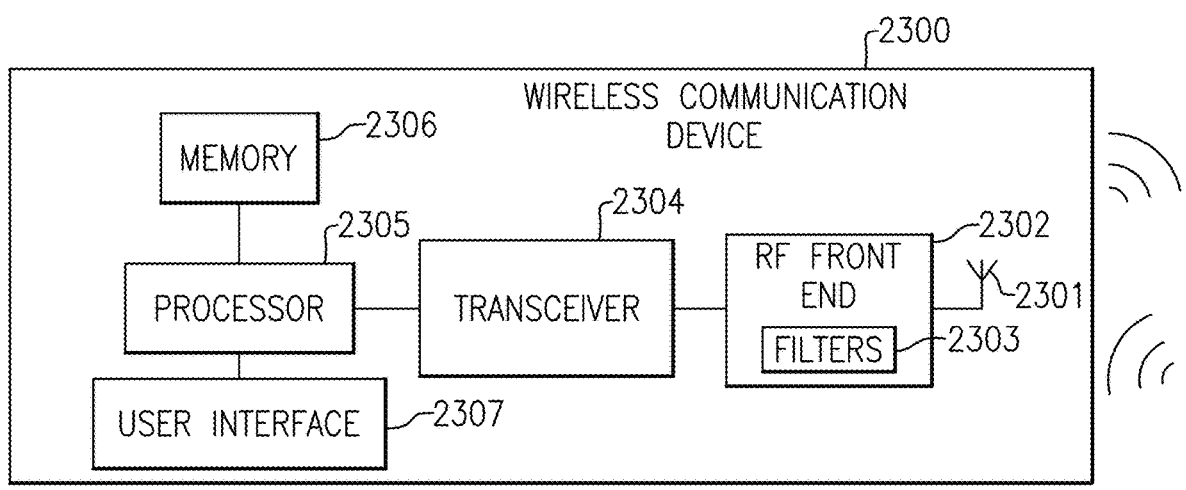
FIG. 16 is a schematic block diagram of a wireless communication device that includes a filter in accordance with one or more embodiments.

FIG. 16 is a schematic diagram of a wireless communication device 2300 that includes filters 2303 in a radio frequency front end 2302 according to an embodiment. The filters 2303 can include one or more SAW resonators in accordance with any suitable principles and advantages discussed herein. The wireless communication device 2300 can be any suitable wireless communication device. For instance, a wireless communication device 2300 can be a mobile phone, such as a smart phone. As illustrated, the wireless communication device 2300 includes an antenna 2301, an RF front end 2302, a transceiver 2304, a processor 2305, a memory 2306, and a user interface 2307. The antenna 2301 can transmit RF signals provided by the RF front end 2302. Such RF signals can include carrier aggregation signals. Although not illustrated, the wireless communication device 2300 can include a microphone and a speaker in certain applications.

The RF front end 2302 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 2302 can transmit and receive RF signals associated with any suitable communication standards. The filters 2303 can include SAW resonators of a SAW component that includes any suitable combination of features discussed with reference to any embodiments discussed above.

The transceiver 2304 can provide RF signals to the RF front end 2302 for amplification and/or other processing. The transceiver 2304 can also process an RF signal provided by a low noise amplifier of the RF front end 2302. The transceiver 2304 is in communication with the processor 2305. The processor 2305 can be a baseband processor. The processor 2305 can provide any suitable base band processing functions for the wireless communication device 2300. The memory 2306 can be accessed by the processor 2305. The memory 2306 can store any suitable data for the wireless communication device 2300. The user interface 2307 can be any suitable user interface, such as a display with touch screen capabilities.

Figure 17:
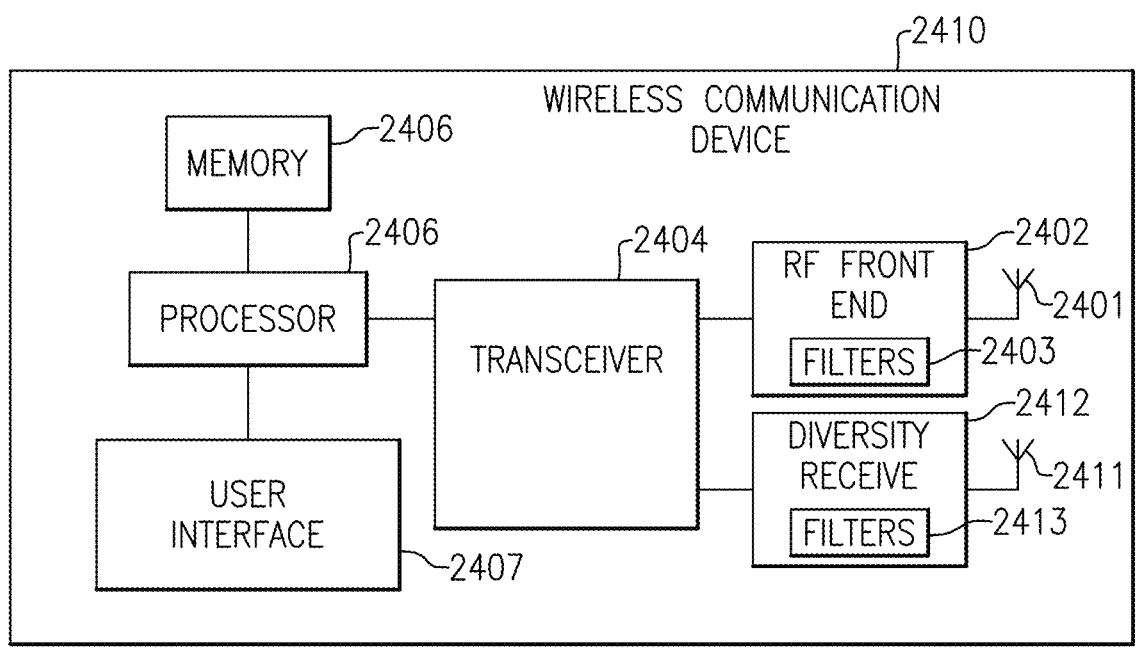
FIG. 17 is a schematic block diagram of another wireless communication device that includes a filter in accordance with one or more embodiments.

FIG. 17 is a schematic diagram of a wireless communication device 2410 that includes filters 2403 in a radio frequency front end 2402 and second filters 2413 in a diversity receive module 2412. The wireless communication device 2410 is like the wireless communication device 2300 of FIG. 16, except that the wireless communication device 2410 also includes diversity receive features. As illustrated in FIG. 17, the wireless communication device 2410 includes a diversity antenna 2411, a diversity module 2412 configured to process signals received by the diversity antenna 2411 and including filters 2413, and a transceiver 2404 in communication with both the radio frequency front end 2402 and the diversity receive module 2412. The filters 2413 can include one or more SAW resonators that include any suitable combination of features discussed with reference to any embodiments discussed above.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as die and/or acoustic wave components and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

Features, materials, characteristics, or groups described in conjunction with a particular aspect, embodiment, or example are to be understood to be applicable to any other aspect, embodiment or example described in this section or elsewhere in this specification unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The protection is not restricted to the details of any foregoing embodiments. The protection extends to any novel one, or any novel combination, of the features disclosed in this specification (including any accompanying claims, abstract and drawings), or to any novel one, or any novel combination, of the steps of any method or process so disclosed.

Furthermore, certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations, one or more features from a claimed combination can, in some cases, be excised from the combination, and the combination may be claimed as a subcombination or variation of a subcombination.

Moreover, while operations may be depicted in the drawings or described in the specification in a particular order, such operations need not be performed in the particular order shown or in sequential order, or that all operations be performed, to achieve desirable results. Other operations that are not depicted or described can be incorporated in the example methods and processes. For example, one or more additional operations can be performed before, after, simultaneously, or between any of the described operations. Further, the operations may be rearranged or reordered in other implementations. Those skilled in the art will appreciate that in some embodiments, the actual steps taken in the processes illustrated and/or disclosed may differ from those shown in the figures. Depending on the embodiment, certain of the steps described above may be removed, others may be added. Furthermore, the features and attributes of the specific embodiments disclosed above may be combined in different ways to form additional embodiments, all of which fall within the scope of the present disclosure. Also, the separation of various system components in the implementations described above should not be understood as requiring such separation in all implementations, and it should be understood that the described components and systems can generally be integrated together in a single product or packaged into multiple products.

For purposes of this disclosure, certain aspects, advantages, and novel features are described herein. Not necessarily all such advantages may be achieved in accordance with any particular embodiment. Thus, for example, those skilled in the art will recognize that the disclosure may be embodied or carried out in a manner that achieves one advantage or a group of advantages as taught herein without necessarily achieving other advantages as may be taught or suggested herein.

Conditional language, such as "can," "could," "might," or "may," unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require the presence of at least one of X, at least one of Y, and at least one of Z.

Language of degree used herein, such as the terms "approximately," "about," "generally," and "substantially" as used herein represent a value, amount, or characteristic close to the stated value, amount, or characteristic that still performs a desired function or achieves a desired result. For example, the terms "approximately", "about", "generally," and "substantially" may refer to an amount that is within less than 10% of, within less than 5% of, within less than 1% of, within less than 0.1% of, and within less than 0.01% of the stated amount. As another example, in certain embodiments, the terms "generally parallel" and "substantially parallel" refer to a value, amount, or characteristic that departs from exactly parallel by less than or equal to 15 degrees, 10 degrees, 5 degrees, 3 degrees, 1 degree, or 0.1 degree.

The scope of the present disclosure is not intended to be limited by the specific disclosures of preferred embodiments in this section or elsewhere in this specification, and may be defined by claims as presented in this section or elsewhere in this specification or as presented in the future. The language of the claims is to be interpreted broadly based on the language employed in the claims and not limited to the examples described in the present specification or during the prosecution of the application, which examples are to be construed as non-exclusive.

Of course, the foregoing description is that of certain features, aspects and advantages of the present invention, to which various changes and modifications can be made without departing from the spirit and scope of the present invention. Moreover, the devices described herein need not feature all of the objects, advantages, features and aspects discussed above. Thus, for example, those of skill in the art will recognize that the invention can be embodied or carried out in a manner that achieves or optimizes one advantage or a group of advantages as taught herein without necessarily achieving other objects or advantages as may be taught or suggested herein. In addition, while a number of variations of the invention have been shown and described in detail, other modifications and methods of use, which are within the scope of this invention, will be readily apparent to those of skill in the art based upon this disclosure. It is contemplated that various combinations or subcombinations of these specific features and aspects of embodiments may be made and still fall within the scope of the invention. Accordingly, it should be understood that various features and aspects of the disclosed embodiments can be combined with or substituted for one another in order to form varying modes of the discussed devices.

What is claimed is:

1. An acoustic wave filter comprising:
a piezoelectric layer;
a first acoustic wave device including a first portion of the piezoelectric layer and a first multi-layer interdigital transducer electrode disposed over the first portion; and
a plurality of additional acoustic wave devices coupled to the first acoustic wave device and including a second portion of the piezoelectric layer and a plurality of multi-layer interdigital transducer electrodes disposed over the second portion, at least one of the plurality of multi-layer interdigital transducer electrodes including a metal layer that is thinner than a corresponding metal layer of a same material of the first multi-layer interdigital transducer electrode, the metal layer being a top layer and having a greater density than any other metal layer of the first multi-layer interdigital transducer electrode, and the metal layer being a top layer and having a greater density than any other metal layer of said at least one of the plurality of multi-layer interdigital transducer electrode.

2. The acoustic wave filter of claim 1 wherein the plurality of additional acoustic wave devices define a multi-mode surface acoustic wave filter coupled to the acoustic wave device, the multi-mode surface acoustic wave filter including a plurality of multi-layer interdigital transducer electrodes longitudinally coupled to each other and including a metal layer that is a top layer of the plurality of multi-layer interdigital transducer electrodes and is thinner than said corresponding metal layer of the same material of the first multi-layer interdigital transducer electrode of the first acoustic wave device.

3. The acoustic wave filter of claim 1 wherein the first multi-layer interdigital transducer electrode and plurality of multi-layer interdigital transducer electrodes include a first layer of a first material density and the metal layer of a second material density that is greater than the first material density.

4. The acoustic wave filter of claim 1 wherein a thickness of the metal layer in a gap region of the first multi-layer interdigital transducer electrode is smaller than a thickness of the metal layer in a center region of the first multi-layer interdigital transducer electrode to thereby reduce a mass loading of the first multi-layer interdigital transducer electrode in the gap region.

5. The acoustic wave filter of claim 1 wherein the first multi-layer interdigital transducer electrode and the plurality of multi-layer interdigital transducer electrodes include a first bus bar, first fingers extending from the first bus bar, a second bus bar, and second fingers extending from the second bus bar.

6. The acoustic wave filter of claim 1 further comprising a temperature compensation layer disposed over the first multi-layer interdigital transducer electrode and the plurality of multi-layer interdigital transducer electrodes.

7. The acoustic wave filter of claim 6 further comprising a passivation layer disposed over the temperature compensation layer.

8. The acoustic wave filter of claim 1 further comprising a pair of mass loading strips disposed over each of the first multi-layer interdigital transducer electrode and the plurality of multi-layer interdigital transducer electrodes, an edge of the mass loading strips aligned with end regions of each of the first multi-layer interdigital transducer electrode and the plurality of multi-layer interdigital transducer electrodes.

9. A radio frequency module comprising:
a package substrate;
an acoustic wave filter configured to filter a radiofrequency signal and including a first acoustic wave device including a first portion of a piezoelectric layer and a first multi-layer interdigital transducer electrode disposed over the first portion, and a plurality of additional acoustic wave devices coupled to the first acoustic wave device and including a second portion of the piezoelectric layer and a plurality of multi-layer interdigital transducer electrodes disposed over the second portion, at least one of the plurality of multi-layer interdigital transducer electrodes including a metal layer that is thinner than a corresponding metal layer of a same material of the first multi-layer interdigital transducer electrode, the metal layer being a top layer and having a greater density than any other metal layer of the first multi-layer interdigital transducer electrode, and the metal layer being a top layer and having a greater density than any other metal layer of said at least one of the plurality of multi-layer interdigital transducer electrode; and
additional circuitry, the acoustic wave filter and the additional circuitry disposed on the package substrate.

10. The radio frequency module of claim 9 wherein the plurality of additional acoustic wave devices define a multi-mode surface acoustic wave filter coupled to the acoustic wave device, the multi-mode surface acoustic wave filter including a plurality of multi-layer interdigital transducer electrodes longitudinally coupled to each other and including a metal layer that is a top layer of the plurality of multi-layer interdigital transducer electrodes and is thinner than said corresponding metal layer of the same material of the first multi-layer interdigital transducer electrode of the first acoustic wave device.

11. The radio frequency module of claim 9 wherein the first multi-layer interdigital transducer electrode and plurality of multi-layer interdigital transducer electrodes include a first layer of a first material density and the metal layer of a second material density that is greater than the first material density.

12. The radio frequency module of claim 11 wherein a thickness of the metal layer in a gap region of the first multi-layer interdigital transducer electrode is smaller than a thickness of the metal layer in a center region of the first multi-layer interdigital transducer electrode to thereby reduce a mass loading of the first multi-layer interdigital transducer electrode in the gap region.

13. The radio frequency module of claim 9 wherein the first multi-layer interdigital transducer electrode and the plurality of multi-layer interdigital transducer electrodes include a first bus bar, first fingers extending from the first bus bar, a second bus bar, and second fingers extending from the second bus bar.

14. The radio frequency module of claim 9 further comprising a pair of mass loading strips disposed over each of the first multi-layer interdigital transducer electrode and the plurality of multi-layer interdigital transducer electrodes, an edge of the mass loading strips aligned with end regions of each of the first multi-layer interdigital transducer electrode and the plurality of multi-layer interdigital transducer electrodes.

15. A wireless communication device comprising:
an antenna; and
a front end module including an acoustic wave filter configured to filter a radio frequency signal associated with the antenna, the acoustic wave filter including a first acoustic wave device including a first portion of a piezoelectric layer and a first multi-layer interdigital transducer electrode disposed over the first portion, and a plurality of additional acoustic wave devices coupled to the first acoustic wave device and including a second portion of the piezoelectric layer and a plurality of multi-layer interdigital transducer electrodes disposed over the second portion, at least one of the plurality of multi-layer interdigital transducer electrodes including a metal layer that is thinner than a corresponding metal layer of a same material of the first multi-layer interdigital transducer electrode, the metal layer being a top layer and having a greater density than any other metal layer of the first multi-layer interdigital transducer electrode, and the metal layer being a top layer and having a greater density than any other metal layer of said at least one of the plurality of multi-layer interdigital transducer electrode.

16. The wireless communication device of claim 15 wherein the plurality of additional acoustic wave devices define a multi-mode surface acoustic wave filter coupled to the acoustic wave device, the multi-mode surface acoustic wave filter including a plurality of multi-layer interdigital transducer electrodes longitudinally coupled to each other and including a metal layer that is a top layer of the plurality of multi-layer interdigital transducer electrodes and is thinner than said corresponding metal layer of the same material of the first multi-layer interdigital transducer electrode of the first acoustic wave device.

17. The wireless communication device of claim 15 wherein the first multi-layer interdigital transducer electrode and plurality of multi-layer interdigital transducer electrodes include a first layer of a first material density and the metal layer of a second material density that is greater than the first material density.

18. The wireless communication device of claim 17 wherein a thickness of the metal layer in a gap region of the first multi-layer interdigital transducer electrode is smaller than a thickness of the metal layer in a center region of the first multi-layer interdigital transducer electrode to thereby reduce a mass loading of the first multi-layer interdigital transducer electrode in the gap region.

19. The wireless communication device of claim 15 wherein the first multi-layer interdigital transducer electrode and the plurality of multi-layer interdigital transducer electrodes include a first bus bar, first fingers extending from the first bus bar, a second bus bar, and second fingers extending from the second bus bar.

20. The wireless communication device of claim 15 further comprising a pair of mass loading strips disposed over each of the first multi-layer interdigital transducer electrode and the plurality of multi-layer interdigital transducer electrodes, an edge of the mass loading strips aligned with end regions of each of the first multi-layer interdigital transducer electrode and the plurality of multi-layer interdigital transducer electrodes.

* * * * *